(12) United States Patent
Wang et al.

(10) Patent No.: US 12,399,769 B2
(45) Date of Patent: Aug. 26, 2025

(54) SYSTEMS AND METHODS FOR DISTRIBUTED STORAGE USING STORAGE CODES WITH FLEXIBLE NUMBER OF NODES

(71) Applicant: The Regents of the University of California, Oakland, CA (US)

(72) Inventors: Zhiying Wang, Irvine, CA (US); Weiqi Li, Irvine, CA (US); Hamid Jafarkhani, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 17/865,950

(22) Filed: Jul. 15, 2022

(65) Prior Publication Data
US 2023/0037969 A1    Feb. 9, 2023

Related U.S. Application Data

(60) Provisional application No. 63/222,218, filed on Jul. 15, 2021.

(51) Int. Cl.
*G06F 11/10*    (2006.01)
*G06F 11/07*    (2006.01)

(52) U.S. Cl.
CPC ...... *G06F 11/0793* (2013.01); *G06F 11/0709* (2013.01); *G06F 11/10* (2013.01)

(58) Field of Classification Search
CPC .. G06F 11/1088; G06F 11/1092; G06F 11/10; G06F 11/1076; G06F 11/1048
See application file for complete search history.

(56) References Cited

U.S. PATENT DOCUMENTS

| | | | |
|---|---|---|---|
| 9,311,194 B1* | 4/2016 | Cypher | G06F 11/3433 |
| 10,860,424 B1* | 12/2020 | Dhuse | G06F 11/1076 |
| 11,474,903 B1* | 10/2022 | Cocagne | G06F 11/1076 |
| 2011/0208994 A1* | 8/2011 | Chambliss | G06F 11/1092 |
| | | | 714/E11.088 |

(Continued)

OTHER PUBLICATIONS

Li, Weiqi. Flexible Coding for Distributed Systems. University of California, Irvine, 2021. (Year: 2021).*

*Primary Examiner* — Yolanda L Wilson
(74) *Attorney, Agent, or Firm* — John Teresinski; Stites & Harbison, PLLC

(57) ABSTRACT

Processes and device configurations are provided for generating and using flexible storage codes. Methods and configurations described herein can reconstruct and recover data from a distributed network in the event of one or more failures or erasures. According to embodiments, a method includes determining the number of nodes and number of symbols of a flexible storage code, and reconstructing the information using the flexible storage code and determined numbers of nodes and symbols. The flexible storage code may be configured for a flexible number of nodes and symbols for information to use a subarray of symbols and nodes of a storage code array for information. Flexible storage codes may provide a framework for a reconstruction configuration using one or more of a flexible locally recoverable code (LRC), flexible partial maximum distance separable code (PMDSC), and flexible minimum storage regenerating code (MSRC).

16 Claims, 6 Drawing Sheets

(56) References Cited

U.S. PATENT DOCUMENTS

| | | | |
|---|---|---|---|
| 2011/0289351 A1* | 11/2011 | Rashmi | H03M 13/616 |
| | | | 714/6.32 |
| 2013/0205181 A1* | 8/2013 | Blaum | G06F 11/108 |
| | | | 714/763 |
| 2015/0142863 A1* | 5/2015 | Yuen | H03M 13/13 |
| | | | 707/827 |
| 2017/0179979 A1* | 6/2017 | Hussain | G06F 11/1076 |
| 2018/0060169 A1* | 3/2018 | Hussain | H03M 13/373 |
| 2019/0140667 A1* | 5/2019 | Ren | H03M 13/3761 |
| 2020/0042390 A1* | 2/2020 | Roberts | G06F 11/1092 |
| 2020/0244284 A1* | 7/2020 | Blaum | H03M 13/2906 |
| 2021/0042036 A1* | 2/2021 | Payton | G06F 3/067 |
| 2022/0091939 A1* | 3/2022 | Dhuse | G06F 11/1088 |

* cited by examiner

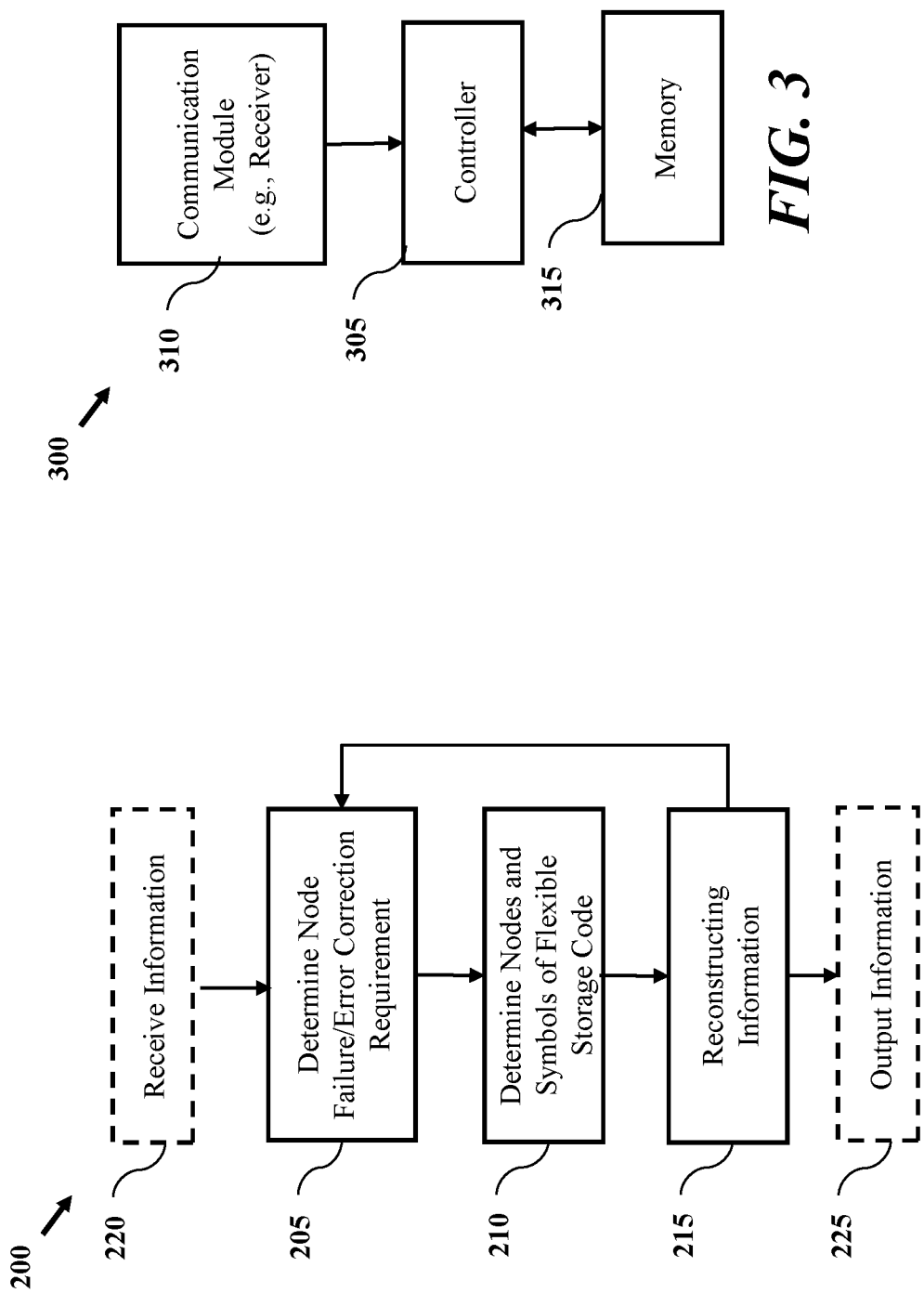

FIG. 5

CONSTRUCTION OF $(n=12, k=4, \ell=3, r=2)$ FLEXIBLE LRC CODE

| | group 1 | | | ... | group 4 | | |
|---|---|---|---|---|---|---|---|
| Layer 1 | $c_{1,1,1}$ | $c_{1,1,2}$ | $c_{1,1,3}$ | ... | $c_{1,1,10}$ | $c_{1,1,11}$ | $c_{1,1,12}$ |
| | $c_{1,2,1}$ | $c_{1,2,2}$ | $c_{1,2,3}$ | ... | $c_{1,2,10}$ | $c_{1,2,11}$ | $c_{1,2,12}$ |
| Layer 2 | $c_{2,1,1}$ | $c_{2,1,2}$ | $c_{2,1,3}$ | ... | $c_{2,1,10}$ | $c_{2,1,11}$ | $c_{2,1,12}$ |

FIG. 6

AN EXAMPLE OF $(5,3,4,2)$ FLEXIBLE PMDS CODE WITH $\{(k_1,\ell_1),(k_2,\ell_2)\} = \{(4,3),(3,4)\}$.

| $c_{1,1,1}$ | △ | $c_{1,1,3}$ | * |
|---|---|---|---|
| $c_{1,2,1}$ | △ | $c_{1,2,3}$ | $c_{1,2,4}$ |
| $c_{1,3,1}$ | △ | * | $c_{1,3,4}$ |
| $c_{2,1,1}$ | △ | $c_{2,1,3}$ | $c_{2,1,4}$ |

FIG. 7

SYSTEMS AND METHODS FOR DISTRIBUTED STORAGE USING STORAGE CODES WITH FLEXIBLE NUMBER OF NODES

CROSS REFERENCE TO RELATED APPLICATION

This application claims priority to U.S. provisional application No. 63/222,218 titled SYSTEMS AND METHODS FOR DISTRIBUTED STORAGE USING STORAGE CODES WITH FLEXIBLE NUMBER OF NODES filed on Jul. 15, 2021, the content of which is expressly incorporated by reference in its entirety.

FIELD

The present disclosure generally relates to systems and networks for distributed storage of data over a plurality of nodes, and more particularly to processes and configurations for using storage codes with a flexible number of nodes.

BACKGROUND

In distributed systems, error-correcting codes are ubiquitous to achieve high efficiency and reliability. However, most codes have a fixed redundancy level. The number of failures varies over time, and as such, the fixed redundancy overcompensates for errors in practical systems and can result in latency. For example, when the number of failures is smaller than the designed redundancy level, the redundant storage nodes are not used efficiently. There is a desire for improvements in storage codes processes and configurations.

Prior configurations have been proposed for error correction to minimize a cost function such as a linear combination of bandwidth, delay or the number of hops. Similarly, other processes have been proposed to reduce the bandwidth or to achieve the optimal field size. One drawback of existing processes may be the requirement of identifying the set of available nodes prior to computing. There is a desire for improvements which address one or more deficiencies of existing systems and improve reconstruction of data.

BRIEF SUMMARY OF THE EMBODIMENTS

Disclosed and described herein are systems, methods and configurations for using flexible storage codes to reconstruct data. According to embodiments, a method for reconstructing data using flexible storage codes includes determining, by a device, a node failure for received information using a storage code for the information, the received information received from at least one of a plurality of storage nodes, and determining, by the device, a number of nodes and a number of symbols of a flexible storage code for error correction, wherein the flexible storage code is generated using the storage code for the information. The method includes reconstructing, by the device, the received information using the determined number of nodes and the number of symbols the of flexible storage code.

In one embodiment, determining a node failure includes identifying at least one node failure from the storage code for the information.

In one embodiment, the plurality storage nodes are in a distributed network and information is received by the device with symbols encoded over a finite field into a number of nodes, the flexible storage code configured for a flexible number of nodes and symbols.

In one embodiment, the number of nodes and the number of symbols of the flexible storage code is determined based on a number of node failures.

In one embodiment, the storage code is at least one of a maximum distance separable (MDS) storage code and a minimum storage regenerating (MSR) storage code.

In one embodiment, the flexible storage code is configured as a flexible locally recoverable code (LRC), wherein flexible LRC is an array code for finite field of information, the array generated based on a code worth length n, dimension k, and code word symbol l, and wherein the code is parametrized by $\{(R_j, k_j, \ell_j): 1 \leq j \leq a\}$ that satisfies $k_j \ell_j = k\ell$, $1 \leq j \leq a$, $k_1 > k_2 \ldots > k_a = k$, $\ell_a = \ell$, and $$R_j = k_j + \frac{k_j}{r} - 1 R_j = k_j + \frac{k_j}{r} - 1,$$

for single node failure recovery from a subset of nodes of the storage code.

In one embodiment, the flexible storage code is configured as a flexible partial maximum distance separable code (PMDSC) wherein, wherein flexible PMDSC is an array code for finite field of information, the array generated based on a code worth length n, dimension k, code word symbol l, and extra symbol failures s, and wherein the code is parametrized by a set of $\{(R_j, k_j, \ell_j): 1 \leq j \leq a\}$ satisfying $k_j \ell_j = k\ell$, $1 \leq j \leq a$, $k_1 > k_2 \ldots > k_a = k$, $\ell_a = \ell$, and $R_j = k_j$ such that hen $\ell_j$ symbols are accessed in each node.

In one embodiment, the flexible storage code is configured as a flexible minimum storage regenerating code (MSRC), wherein repair bandwidth is a minimum amount of transmission required to repair a single node failure from all remaining nodes normalized by size of the node, wherein the repair bandwidth is bounded by the minimum storage regenerating (MSR) bound as $$b \geq \frac{n-1}{n-k}.$$

based on a code worth length n, and dimension k.

In one embodiment, reconstructing the received information with the number of nodes and the number of symbols of a flexible storage code includes using a subarray of nodes and symbols of the storage code for the information.

In one embodiment, the method also includes updating the number of nodes and number of symbols of the flexible storage code for error correction of additional information.

Embodiments are also directed to a device configured to reconstruct data using flexible storage codes. The device includes a receiver configured to receive information from a distributed network and a controller. The controller configured to determine a node failure for received information using a storage code for the information, the received information received from at least one of a plurality of storage nodes, and determine a number of nodes and a number of symbols of a flexible storage code for error correction, wherein the flexible storage code is generated using the storage code for the information. The controller also configured to reconstruct the received information using the determined number of nodes and the number of symbols the of flexible storage code.

Other aspects, features, and techniques will be apparent to one skilled in the relevant art in view of the following detailed description of the embodiments.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein:

FIG. 2 illustrates a process for using flexible storage codes to reconstruct data according to one or more embodiments;

FIG. 3 depicts a device configuration according to one or more embodiments;

FIG. 5 illustrates a graphical representation of a multiple-layer codes according to one or more embodiments;

FIG. 6 illustrates a graphical representation of a flexible LRC storage code according to one or more embodiments;

FIG. 7 illustrates a graphical representation of a flexible PMDS storage code according to one or more embodiments.

DETAILED DESCRIPTION OF THE EXEMPLARY EMBODIMENTS

Overview and Terminology

Figure 1:
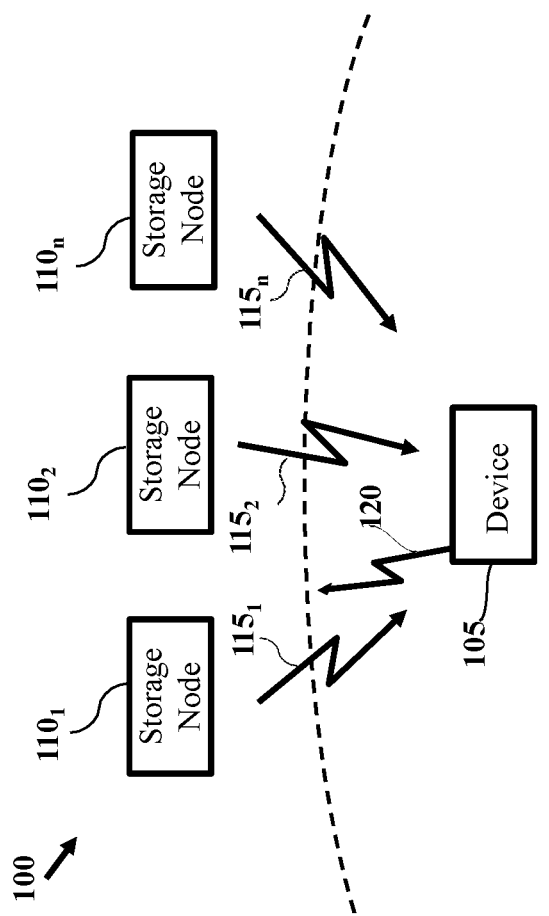
FIG. 1 illustrates a system according to one or more embodiments.

According to embodiments, a system, methods and device configurations are provided for flexible storage codes that make it possible to recover the entire information through accessing a flexible number of nodes. According to embodiments, flexible storage codes are a class of error-correcting codes that can recover information from a flexible number of storage nodes. As a result, processes and devices make a better use of the available storage nodes in the presence of unpredictable node failures and reduce the data access latency. According to embodiments, use of flexible storage codes may include use of a framework for accessing and correction of data.

In distributed systems, error-correcting codes are ubiquitous to achieve high efficiency and reliability. Unlike codes that have a fixed redundancy level, embodiments provide solutions for systems and processes where the number of failures varies over time. When the number of failures is smaller than the designed redundancy level, the redundant storage nodes are not used efficiently. Embodiments provide flexible storage codes that make it possible to recover the entire information through accessing a flexible number of nodes.

Methods and systems are thus described in the various embodiments for using flexible storage codes. Methods and systems described herein may apply to distributed storage system in which storage infrastructure can split data across multiple physical servers, and often across more than one data center. A cluster of storage units may provide information to one or more devices, with a mechanism for data synchronization and coordination between cluster nodes. In the event of a data error, such as one or more nodes of the system failing to provide data, flexible correction codes are provided that can account for the failure of nodes such that the number of symbols and/or parities may be selected for correction.

According to embodiments, multiple constructions of Flexible MDS codes may be utilized for different application scenarios including error-correction codes, universally decodable matrices, secret sharing and private information retrieval. Embodiments provide a framework that can produce flexible storage codes for different code families including important types of storage codes, such as codes that efficiently recover from a single node failure, or codes that correct mixed types of node and symbol failures. Embodiments of the disclosure include a framework for flexible codes that can generate flexible storage codes given a construction of fixed (non-flexible) storage code.

Flexible LRC (locally recoverable) codes allow information reconstruction from a variable number of available nodes while maintaining the locality property, providing efficient single node recovery. According to embodiments, for an (n, k, $\ell$, r) flexible LRC code parametrized by $\{(R_j, k_j, \ell_j): 1 \leq j \leq a\}$ that satisfies $k_j \ell_j = k\ell$, $1 \leq j \leq a$, $k_1 > k_2 > \ldots > k_a = k$, $\ell_a = \ell$, and $$R_j = k_j + \frac{k_j}{r} - 1;$$

each single node failure can be recovered from a subset of r nodes, while the total information is reconstructed by accessing $\ell_j$ symbols in $R_j$ nodes. Embodiments provide code constructions based on the optimal LRC code construction.

Embodiments can be applied to using Flexible PMDS (partial MDS) codes are designed to tolerate a flexible number of node failures and a given number of extra symbol failures, desirable for solid-state drives due to the presence of mixed types of failures. We provide an (n, k, $\ell$, s) with a set of $\{(R_j, k_j, \ell_j): 1 \leq j \leq a\}$ satisfying $k_j \ell_j = k\ell$, $1 \leq j \leq a$, $k_1 > k_2 \ldots > k_a = k$, $\ell_a = \ell$, and $R_j = k_j$ such that when $\ell_j$ symbols are accessed in each node, we can tolerate n−$R_j$ failures and s extra symbol failures. Embodiments, construct flexible codes from the PMDS code.

Embodiments can be applied to using Flexible MSR (minimum storage regenerating) codes as a type of flexible MDS codes such that a single node failure is recovered by downloading the minimum amount of information from the available nodes. Both vector and scalar codes are obtained by applying our flexible code framework to the MSR codes.

The disclosure provides an analysis of benefits including latency analysis for flexible storage codes. It is demonstrated that flexible storage codes according to embodiments have a lower latency compared to the corresponding fixed codes.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment," "certain embodiments," "an embodiment," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation.

EXEMPLARY EMBODIMENTS

FIG. 1 illustrates a system according to one or more embodiments. System 100 is a distributed storage system including a plurality of storage devices, such as storage nodes $110_{1-n}$, which may be configured to store and provide information to devices, such as device 105. Storage nodes $110_{1-n}$, may be configured to store information over a plurality of nodes, and provide information by way of one or more transmissions to a requesting device. According to embodiments, a framework for storage codes with a flexible number of nodes is provided. Information provided by the network may be transmitted with a storage code, the storage code including data to allow for error correction. The framework for flexible storage codes may be used by way of processes and device configurations. As described herein, device 105, and/or one or more applications running on device 105, may be configured to request data from distributed network 100. Device 105 may be a computing device, mobile device or device in general including a processer. Storage nodes $110_{1-n}$ may be servers or other computing devices configured for network communication. According to embodiments, storage nodes may represent storage locations of a memory storage device. Storage nodes $110_{1-n}$ may transmit data by way of wired and/or wireless communication to device 105 and one or more other devices. In the event of a node failure or error in in transmission of data, flexible storage nodes may be used for reconstruction. According to certain embodiments, processes and configurations discussed herein may be employed for storage of data by system 100, such as data 120 provided by device 105 to storage nodes $110_{1-n}$.

As used herein, flexible storage codes may function to provide error correction. As further discussed herein the number of symbols and nodes used in a correction code may be based on the error. By way of example, two symbols may be accessed in three nodes, or three symbols may be access in two nodes depending on the error. Processes and device configurations described herein are configured to determine the number of symbols and nodes used in a correction.

FIG. 2 illustrates a process for using flexible storage codes to reconstruct data according to one or more embodiments. According to embodiments, process 200 may be performed by a device (e.g., device 105) requesting data and/or one or more storage devices of the distributed network (e.g., storage nodes $110_{1-n}$) and one or more devices of a system (e.g., system 100). Process 200 may be performed by a device when information is received in a distributed network. Embodiments characterizing a distributed network may include information received from one or more sources or storage nodes. According to embodiments, operations may be performed for data received from one or more storage sources or devices. According to yet other embodiments, operations may be based on information stored with a storage code, such as least one of a maximum distance separable (MDS) storage code and a minimum storage regenerating (MSR) storage code.

Process 200 may be initiated by a device determining that an error correction is required for information stored in a distributed network at block 205. An error correction may be identified based on the failure or one or more nodes of the distributed network. Process 200 may be performed after information is received. Process 200 may optionally include receiving data, information, at block 220. The device may identify that an error correction is required based on data received. Data received can include transmitted information and storage code information for the transmitted information. In a distributed network, data may be received from one or more storage nodes. Similarly, transmitted information may be transmitted in packets or groupings, such that an information stream may include one or more blocks or nodes of data. Determinations of node failure may be determined when data is not received from a storage device. Similarly, node failure may be based on a block of data that is part of a stream is not received from a storage device. Similarly, node failure may be determined when data is received with one or more errors. Embodiments can utilize storage code to recreate and/or regenerate damaged or missing data. Data with one or more errors, due to transmission errors, detection errors, etc., may be identified using one or more of symbols and parities in storage code associated with the data. With data transmission, speed and elimination of redundancy can improved device performance. Embodiments allow for operations to use flexible storage codes, such that the number of symbols and nodes of a storage code may be selected in order to reconstruct data. According to embodiments, process 200 can reconstruct data using one or more flexible storage codes described herein.

At block 205, process 200 may be performed by a device to determine a node failure for received information using a storage code for the information. The received information may be received from at least one of a plurality of storage nodes. The received information may be received in one or more blocks of code, the received blocks of code may be considered nodes for purposes of the disclosure. Node failure may be determined by identifying at least one node failure from the storage code using the storage code information. According to embodiments, one or more symbols encoded with the received information may be used to identify a node failure and/or node error. A plurality of storage nodes of a distributed network may provide information that is received by the device with symbols encoded over a finite field into a number of nodes. According to embodiments, information that can be broken up into blocks to include, each block being a node of information and where each block includes a storage code as symbols. Symbols of the blocks may also include parities to allow for error correction. According to embodiments and as described herein, a flexible storage code is used to identify and operate with a portion of transmitted symbols to provide a flexible number of nodes and symbols. Unlike error correction codes that use a fixed number of symbols, the fixed number of symbols being a subset of available symbols, processes described herein determine the number of symbols and nodes to use in received information for error correction. Determining the number and nodes of storage code may be based on the number of failures for received information.

At block 210, process 200 includes determining a number of nodes and number of symbols of a flexible storage code for error correction. According to embodiments, a system providing information may encode storage codes as information symbols over a finite field into a number of nodes. Nodes of the storage code relate to one or more nodes of data that are received of the information storage code. Storage code may be arranged as an array of codes including parameters for code word length, dimension, and size of each node. According to embodiments, the number of nodes and the number of symbols is determined based on number of failures and based on values of storage code information.

Process 200 illustrates use of flexible storage codes, as a class of error-correcting codes that can recover information from a flexible number of storage nodes. According to embodiments, flexible storage codes relates to the use of elements within a storage code. By minimizing and/or selecting parameters of storage code, one or more of efficiency and speed of error correction may be improved. As a result, process 200 can make a better use of the available storage nodes in the presence of unpredictable node failures and reduce the data access latency. Process 200, and embodiments herein, may characterize a storage system that encodes $k\ell$ information symbols over a finite field $\mathbb{F}$ into n nodes, each of size $\ell$ symbols. The code is parameterized by a set of tuples $\{(R_j, k_j, \ell_j): 1 \leq j \leq a\}$ satisfying $k_1 \ell_1 = k_2 \ell_2 = \ldots = k_a \ell_a$ and $k_1 > k_2 \ldots > k_a = k$, $\ell_a = \ell$, such that the information symbols can be reconstructed from any $R_j$ nodes, each node accessing $e_j$ symbols. In other words, the code allows a flexible number of nodes for decoding to accommodate the variance in the data access time of the nodes. Code constructions are presented for different storage scenarios, including LRC (locally recoverable) codes, PMDS (partial MDS) codes, and MSR (minimum storage regenerating) codes. As discussed herein analysis is provided for the latency of accessing information. According to other embodiments, the flexible storage code of process 200 may be configured as a code construction, such as one or more of a flexible locally recoverable code (LRC), flexible partial maximum distance separable code (PMDSC), and a flexible minimum storage regenerating code (MSRC).

In one embodiment, the flexible storage code is configured as a flexible locally recoverable code (LRC), wherein flexible LRC is an array code for finite field of information, the array generated based on a code worth length n, dimension k, and code word symbol l, and wherein the code is parametrized by $\{(R_j, k_j, \ell_j): 1 \leq j \leq a\}$ that satisfies $k_j \ell_j = k\ell$, $1 \leq j \leq a$, $k_1 > k_2 \ldots > k_a = k$, $\ell_a = \ell$, and $$R_j = k_j + \frac{k_j}{r} - 1,$$

for single node failure recovery from a subset of nodes of the storage code.

In one embodiment, the flexible storage code is configured as a flexible partial maximum distance separable code (PMDSC) wherein, wherein flexible PMDSC is an array code for finite field of information, the array generated based on a code worth length n, dimension k, code word symbol l, and extra symbol failures s, and wherein the code is parametrized by a set of $\{(R_j, k_j, \ell_j): 1 \leq j \leq a\}$ satisfying $k_j \ell_j = k\ell$, $1 \leq j \leq a$, $k_1 > k_2 \ldots > k_a = k$, $\ell_a = \ell$, and $R_j = k_j$ such that hen $\ell_j$ symbols are accessed in each node.

In one embodiment, the flexible storage code is configured as a flexible minimum storage regenerating code (MSRC), wherein repair bandwidth is a minimum amount of transmission required to repair a single node failure from all remaining nodes normalized by size of the node, wherein the repair bandwidth is bounded by the minimum storage regenerating (MSR) bound as $$b \geq \frac{n-1}{n-k}.$$

based on a code worth length n, and dimension k.

Figure 4:
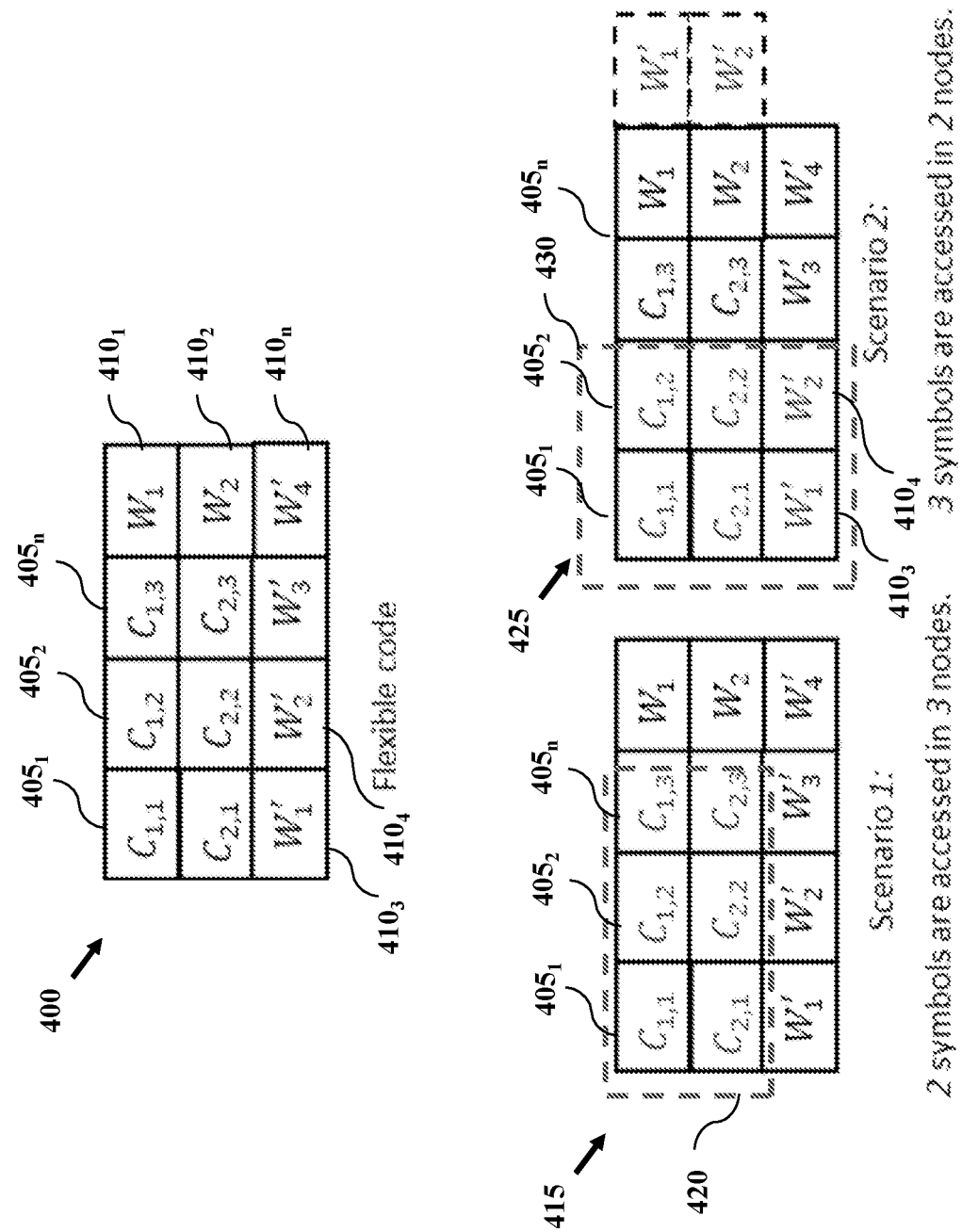
FIG. 4 illustrates a graphical representation of a flexible storage code according to one or more embodiments.

At block 215, process 200 includes reconstructing information using the flexible storage code and determined numbers of nodes and symbols of the flexible storage code using a subarray of nodes and symbols of the storage code for the information. Process 200 may include utilization of the number of symbols accessed and the number of nodes accessed. By way of example, two symbols may be accessed in three nodes or three symbols may be accessed in two nodes as is shown in FIG. 4. It should be appreciated that other numerical combinations may be utilized based on the disclosure.

Process 200 may include determining one or more additional nodes or symbols to use for decoding of other information. By way of example, after correction at block 215, process 200 may include detection of a node failure at block 205, such that particulars of the failure and number of failed nodes can be used for additional and/or subsequent error correction. As such, process 200 may include updating the number of nodes and number of symbols of the flexible storage code for error correction of additional information.

At optional block 225, process 200 may output of reconstructed information. Reconstructed information may provide the information requested from a distributed network, even in the event of a storage node failure or error in transmission.

FIG. 3 depicts a device configuration according to one or more embodiments. Device 300 may relate to computing device (e.g., device 105) configured to device configured for reconstructing data using flexible storage codes. According to one embodiment, receiver 300 includes controller 305, memory 310 and communications module 315. Controller 305 may relate to a processor or control device configured to execute one or more operations stored in memory 310. Controller 305 may be coupled to memory 310 and communication module 315. Communication module 315 may be configured to receive information from a distributed network. According to one embodiment, controller 305 is configured to determine that error correction is required for the information, determine a number of nodes and number of symbols of a flexible storage code, and reconstruct the information using the flexible storage code and determined numbers of nodes and symbols.

FIG. 4 illustrates a graphical representation of a flexible storage code according to one or more embodiments. According to embodiments, flexible storage code 400 can include a includes a plurality of information symbols $405_{1-n}$ and a plurality of parities $410_{1-n}$. Flexible storage code 400 may be used to reconstruct information from a distributed network in the event of one more failures. Flexible storage code 400 may be an array code to describe information of a distributed network. According to embodiments, an $(n, k, \ell)$ field F is denoted by $(C_1, C_2, \ldots, C_n)$, $C_i = (C_{1,i}, C_{2,i}, \ldots, C\ell_{,i})^T \in \mathbb{F}\ell$, where n is the code word length, k is the dimension, and $\ell$ is the size of each node (or code word symbol) and is called the sub-packetization size. According to embodiments, processes may assume that for an $(n, k, \ell)$ code the entire information may be recovered by downloading all the symbols from any R nodes. According to embodiments, the download time of the slowest node among the R nodes is defined as the data access latency. In practical systems, the number of available nodes might be different over time and the latency of each node can be modelled as a random variable. Waiting for downloading all $\ell$ symbols from exactly R nodes may result in a large delay. Hence, it is desirable to be able to adjust R and $\ell$ according to the number of failures.

Motivated by reducing the data access latency, embodiments provide flexible storage codes. According to embodiments, a flexible storage codes is an (n, k, $\ell$) code that is parameterized by a given integer a and a set of tuples $\{(R_j, k_j, \ell_j): 1 \leq j \leq a\}$ that satisfies $k_j \ell_j = k\ell$, $1 \leq j \leq a$, $k_1 > k_2 \ldots > k_a = k$, $\ell_a = \ell$, and if we take $\ell_j$ particular coordinates of each code word symbol, denoted by $(C_{m_1,i}, C_{m_2,i}, \ldots, C_{m\ell_j,i})^T \mathbb{F}$ $\ell_j \in [n]$ where [n] is the set of integers smaller or equal to n, we can recover the entire information from any $R_j$ nodes.

For example, flexible maximum distance separable (MDS) codes are codes satisfying the singleton bound for each $k_j$, namely, $\{(R_j, k_j, \ell_j): 1 \leq j \leq a\}$. FIG. 4 shows an example. It is easy to see that the flexible code in the example has a better expected latency than a fixed code with either k=2 or 3. In particular, each node can read and then send its three symbols one by one to the decoder (in practice, each symbol can be viewed as, for example, several Megabytes when multiple copies of the same code are applied). The flexible decoder can wait until 2 symbols from any 3 nodes, or 3 symbols from any 2 nodes are delivered, whose latency is the minimum of the two fixed codes.

According to embodiments, flexible code 400 is an example of a (4; 2; 3) flexible MDS code. Flexible code 400 includes a plurality of information symbols 405$_{1-n}$ (e.g., $C_{1,1}$; $C_{1,2}$; $C_{1,3}$; $C_{2,1}$; $C_{2,2}$; $C_{2,3}$)) and in this example six (6) information symbols. Flexible code 400 includes a plurality of parities 410$_{1-n}$ (e.g., $W_1 = C_{1,1} + C_{1,2} + C_{1,3}$, $W'_1 = C_{1,1} + 2 C_{1,2} + 3 C_{1,3}$, are the parities for $C_{1,1}$, $C_{1,2}$, $C_{1,3}$, and $W_2 = C_{2,1} + C_{2,2} + C_{2,3}$; $W'_2 = C_{2,1} + 2 C_{2,2} + 3 C_{2,3}$ are the parities for $C_{2,1}$, $C_{2,2}$, $C_{2,3}$. FIG. 4 illustrates two scenarios, including a first scenario 415 ("Scenario 1"), and second scenario 425 ("Scenario 2"). The accessed symbols in each scenario are marked as 420 and 430. $W'_3 = W'_1 + W'_2$; $W'_4 = W'_1 + 2 W'_2$ are the parities of W'1 and W'$_2$. In Scenario 1, shown as 415, all the information symbols are accessed, including information symbols 405$_{1-n}$, the entire information can be obtained directly. In Scenario 2, shown as 425, W'$_1$ and W'$_2$, shown as 410$_3$ and 410$_4$, are also the parities in Rows 1 and 2, respectively. Thus, according to embodiments, three symbols are obtained in the first two rows, and the entire information can be decoded.

Framework for Flexible Storage Codes

Embodiments are direct to providing flexible storage codes and to provide a framework for flexible codes to convert a fixed (e.g., non-flexible) code construction into a flexible one. For the purpose of illustration, a flexible MDS code example is used. Other types of code constructions are discussed herein.

According to embodiments, a flexible storage code may be defined to incorporate a code word represented by an $\ell \times n$ array over $\mathbb{F}$, denoted as $C \in (\mathbb{F} \ell)$, where n is called the code length, and $\ell$ is called the sub-packetization. Each column in the code may correspond to a storage node. Embodiments can include selecting some fixed integers $j \in [a]$, $\ell_j \in [\ell](\mathbb{F} \ell)$, and recovery thresholds $R_j \in [n]$. Let the decoding columns $R_j \subseteq [n]$ be a subset of $R_j$ columns, and the decoding rows $I_1, I_2, \ldots, I_R \subseteq [\ell]$ be subsets of rows each with size $\ell_j$. Denote by $C|I_1, I_2, \ldots, I_{R_j}$ the $\ell_j \times R_j$ subarray of C that takes the rows $I_1$ in the first column of $R_j$, the rows $I_2$ in the second column of $R_j$, ..., and the rows $I_k$ in the last column of $R_j$. The information will be reconstructed from this subarray. For flexible MDS codes, flexible MRS codes and flexible PMDS codes, the following is required: $R_j = k_j$. According to embodiments, for the above types of codes, the parameter $R_j$ may be omitted.

For flexible LRC codes, the following is required:

$$R_j = k_j + \frac{k_j}{n - k_j} + 1,$$

since the maximum distance is lower bounded by $$n - k_j - \frac{k_j}{n - k_j} + 2.$$

The (n, k, $\ell$) flexible storage code is parameterized by $(R_j, k_j, \ell_j) j \in [a]$, for some positive integer a, such that $k_j \ell_j = k\ell$, $1 \leq j \leq a$, $k_1 > k_2 \ldots > k_a = k$, $\ell_a = \ell$. The flexible storage code encodes $k\ell$ information symbols over a finite field $\mathbb{F}$ into n nodes, each with $\ell$ symbols. The code satisfies the following reconstruction condition for all $j \in [a]$: from any $R_j$ nodes, each node accesses a set of $\ell_j$ symbols, and we can reconstruct all the information symbols, for any $j \in [a]$. That is, the code is defined by
an encoding function $\varepsilon$: $(\mathbb{F} \ell)^k \rightarrow (\mathbb{F} \ell)^n$,
decoding functions $D_{R_j}$: $(\mathbb{F} \ell^j)^{R_j} \rightarrow (\mathbb{F} \ell)^k$, for all $R_j \subseteq [n]$, $|R_j| = R_j$, decoding rows $I_1, I_2, \ldots, I_{R_j} \subseteq [\ell]$, $|I_1| = |I_2| = \ldots = |I_{R_j}| = \ell_j$, which are dependent on the choice of decoding columns $R_j$.

The functions are chosen such that any information $\mathcal{U} \in (\mathbb{F} \ell)^k$ can be reconstructed from the nodes in $R_j$:

$$D_{R_j}\left(\varepsilon(U)|_{I_1, I_2, \ldots, I_{R_j}}\right) = \mathcal{U}.$$

According to embodiments, a flexible MDS code is define as a flexible storage code, such that $R_j = k_j$.

FIG. 4 illustrates an example of a (n, k, $\ell$)=(4, 2, 3) flexible MDS code parameterized by $(k_j, \ell_j) \in \{(3,2), (2,3)\}$. In this example, $k\ell = 6$ information symbols are encoded over $\mathbb{F}$ to a code with n=4, k=2, $\ell$=3.

Embodiments are also directed to decoding. From any $k_1 = 3$ nodes, each node accesses the first $\ell_1 = 2$ symbols: The first 2 rows form a single parity-check (4; 3; 2) MDS code, and thus a device can determine information symbols from any 3 out of 4 symbols in each row. From any $k_2 = 2$ nodes, each node accesses all the $\ell_2 = 3$ symbols. According to embodiments, operations can include first decoding W'$_1$ and W'$_2$ in the last row since the last row is a (4; 2; 1) MDS code. Then, $(C_{1,1}, C_{1,2}, C_{1,3}, W_1, W'_1)$ and ) and $(C_{2,1}, C_{2,2}, C_{2,3}, W_2, W'_2)$ form two (5,3,1) MDS codes. According to embodiments, all the information symbols can be decoded from W'$_1$, W'$_2$ and any 2 columns of the first 2 rows.

According to embodiments, construction of a code may be based on a set of $(n+k_j-k_a, k_j, \ell_j - \ell_{j-1})$ codes, each code called a layer, such that $k_j \ell_j = k\ell$, $1 j \in [a]$, $k_1 > k_2 \ldots > k_a = k$, $\ell_a = \ell$, $\ell_0 = 0$. The first layer is encoded from the original information symbols and other layers are encoded from the "extra parities". The intuition for the flexible reconstruction is that after accessing symbols from some layers, we can decode the corresponding information symbols, which is in turn extra parity symbols in an upper layer. Therefore, the decoder can afford accessing less code word symbols in the upper layer, resulting in a smaller recovery threshold.

Figure 5:
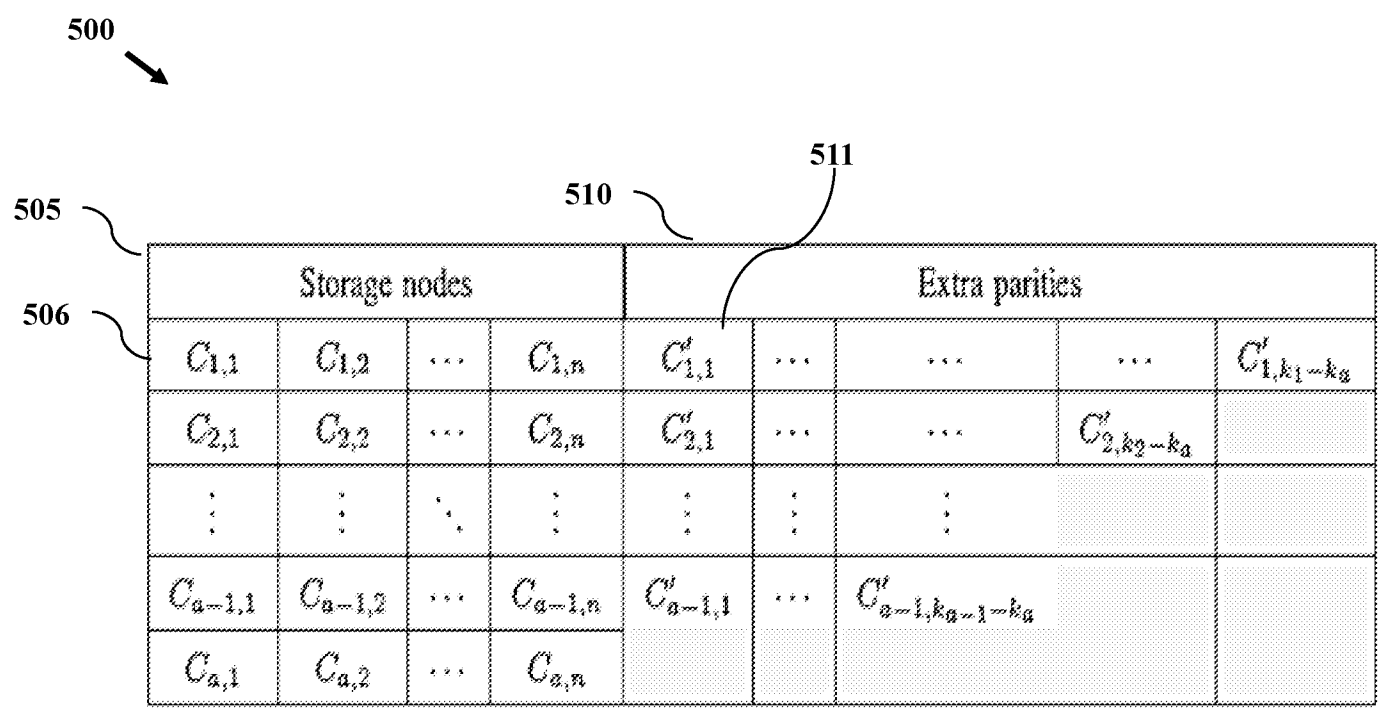

FIG. 5 illustrates a graphical representation of a multiple-layer codes according to one or more embodiments. FIG. 5 illustrates a graphical representation of storage codes 500 including storage nodes 505, extra parities 510. Storage codes 500 include (n, k, $\ell$) flexible storage codes parameterized by $\{(k_j, \ell_j):1\leq j\leq a\}$, such that $k_j\ell_j=k\ell$, $1\leq j\leq a$, $k_1>k_2\ldots>k_a=k$, $\ell_a=\ell$.

Each column, such as column 506, of storage codes 500 is a node. Note that only the first n columns under storage nodes are stored, and the extra parities are auxiliary. Set $\ell_0=0$. We have a layers, and Layer j, $j\in[a]$, is an $(n+k_j-k_a, k_j, \ell_j-\ell_{j-1})$ code $$[(C_{j,1},C_{j,2},\ldots,C_{j,n}),C'_{j,1},C'_{j,2}\ldots C'_{j,K_j-k_a}]$$

where $C_{j,i}=[C_{j,1,i}, C_{j,2,i}, \ldots, C_{j,k_j-k_j,i}]^T \in \mathbb{F}^{\ell_j-\ell_{j-1}}$, $i\in[n]$ are actually stored and $C'_{j,i}=[C'_{j,1,i}, C'_{j,2,i}, \ldots, C'_{j,\ell_j-\ell_{j-1},i}]^T \in \mathbb{F}^{\ell_j-\ell_{j-1}}$, $i\in[k_j-k_a]$, such as 511, are the auxiliary extra parities. The $(n+k_l-k_a, k_l, \ell_l)$ code in the first layer is encoded from the $k_l\ell_l=k\ell$ information symbols over $\mathbb{F}^\ell$, and the $(n+k_j-k_a, k_j, \ell_j-\ell_{j-1})$ code in Layer j, $j\geq 2$, is encoded from extra parities $C'_{j',i}$, for $j'\in[j-1]$, $k_j-k_a+1\leq i\leq k_{j-1}-k_a$. As a sanity check, $\Sigma_{j'=1}^{j-1}(k_{j-1}-k_j)(\ell_{j'}-\ell_{j'-1})=(k_{j-1}-k_j)(\ell_{j-1}-\ell_0)=k_j(\ell_j-\ell_{j-1})$ extra parities over $\mathbb{F}$ are encoded into Layer j, which matches the code dimension in that layer. In this example, $\ell_0=0$ and $k_{j-1}\ell_{j-1}=k_j\ell_j$.

According to embodiments, the construction discussed above can be applied to different kinds of codes. For an (n, k, $\ell$) flexible MDS code, the entire information can be recovered from any $k_j$ nodes, each node accessing its first $\ell_j$ symbols.

Embodiments also provide for the application of flexible codes to LRC (locally recoverable codes, PMDS (partial maximum distance separable) codes, and MSR (minimum storage regenerating) codes. These codes provide a flexible construction mechanism for the entire information, and either can reduce the single-failure repair cost (i.e., the number of helper nodes and the amount of transmitted information), or can tolerate a mixed types of failures. Application include failure protection in distributed storage systems and in solid-state drives.

Flexible LRC

An $(n,k,\ell,r)$ LRC code is defined as a code with length n, dimension k, sub-packetization size $\ell$ and locality r. Locality here means that for any single node failure or erasure, there exists a group of at most r available nodes (called helpers) such that the failure can be recovered from them. The minimum Hamming distance of an $(n,k,\ell,r)$ LRC code is lower bounded in as $$d_{min} \geq n - k - \left\lceil\frac{k}{r}\right\rceil + 2,$$

and LRC codes achieving the bound are called optimal LRC codes. For simplicity, using (n,k,r) LRC codes to present $(n,k,\ell,r)$ LRC codes with $\ell=1$. According to embodiments, an LRC code may be optimal when (n,k,r) LRC codes encode k information symbols into $$C = \left[C_{1,1}, C_{1,2}, \ldots, C_{1,r+1}, \ldots, C_{\frac{n}{r+1},1}, C_{\frac{n}{r+1},2}, \ldots, C_{\frac{n}{r+1},r+1}\right]$$

where each group $$\{C_{m,i}:i \in [r+1]\}, m \in \left[\frac{n}{r+1}\right]$$

is an MDS code with dimension r and the whole code C has a minimum distance of $$n - k - \left\lceil\frac{k}{r}\right\rceil + 2$$

such that all the information symbols can be decoded from any $$k + \left\lceil\frac{k}{r}\right\rceil - 1$$

nodes.

According to embodiments, the $(n,k,\ell,r)$ flexible LRC code may be defined as parameterized by $\{(R_j, k_j, \ell_j): 1\leq j\leq a\}$ as a flexible storage code, such that all the symbols of any node can be recovered by reading at most r other nodes, and $$R_j = k_j + \frac{k_j}{n - k_j} + 1.$$

The above $R_j$ matches the minimum distance lower bound. As a result, our definition of flexible LRC code may imply optimal minimum Hamming distance when we consider all symbols at each node. In the flexible LRC code, first, extra groups are generated in each row. Then, r extra parities are chosen from each extra group and encoded into lower layers. During information reconstruction, extra parities and hence extra groups are recovered from lower layers, leading to a smaller number of required access.

FIG. 6 illustrates a graphical representation of a flexible LRC storage code according to one or more embodiments. LRC code 600 is shown for an example construction of (n=12; k=4; $\ell$=3; r=2) flexible LRC code. In this code, Rows 1 and 2 are (n=12; k=6; r=2) LRC codes encoded from the information, and one extra group is generated in each row. Four extra parities may be taken from the extra groups, which are encoded into (n=12; k=4; r=2) LRC code in Row 3. In this example, there are 12 nodes and the nodes are evenly divided into four groups. Any single failed node can be recovered from the other two nodes in the same group. To recover the entire information, any eight nodes are required, each accessing the first two symbols, or any five nodes, each accessing all three symbols.

Applying optimal LRC codes by groups to the construction determined herein for flexible codes, a $(n,k,\ell,r)$ flexible LRC code may be parameterized by $\{(R_j, k_j, \ell_j):1\leq j\leq a\}$. In this example, n may be divisible by r+1 and all $k_j$'s are divisible by r here. The code is defined in $\mathbb{F}$ of size at least $$n + (k_1 - k_a) + \frac{r+1}{r}.$$

The resulting code turns out to be an $(n,k_j,\ell_j, r)$ LRC code when $\ell_j$ symbols are accessed at each node. That is, for any single node failure, there exists a group of at most r helpers such that the failure can be recovered from them.

According to embodiments, the construction of a flexible LRC code results in a flexible LRC code with locality r and $\{(R_j, k_j, \ell_j): 1\leq j\leq a\}$.

According to embodiments, encoding can be applied such that in a layer j, an optimal LRC code of $$\left(n + (k_j - k_a)\frac{r+1}{r}, k_j, r\right), j \in [a]\ell_0, = 0$$

may be applied to each row. The $k\ell$ information symbols in the $\ell_j$ rows of Layer 1, and the remaining rows may be encoded from extra parities.

Embodiments include choosing the n stored symbols and the $k_j - k_a$ extra parities in each row. In a $$\left(n + (k_j - k_a)\frac{r+1}{r}, k_j, r\right)$$

LRC code, there may be $$\frac{n}{r+1} + \frac{k_j - k_a}{r}$$

groups. The $$\frac{n}{r+1} + \frac{k_j - k_a}{r}$$

groups are selected containing n symbols. The, n stored symbols in each row form an (n, $k_j$, r), j|∈[a] optimal LRC code. In the remaining $$\frac{k_j - k_a}{r}$$

groups, r nodes may be selected in each group which contains $k_j - k_a$ nodes, as extra parities. Since all the information symbols are encoded in Layer 1, information symbols can be decoded if enough dimensions to decode Layer 1 are obtained.

Embodiments allow for decoding all information symbols from any $$R_j = k_j + \frac{k_j}{r} - 1, j \in [a]$$

nodes, each nodes accesses the first $\ell_j$ symbols.

From layer j, since each row of it is part of the $$(n + (k_j - k_a)\frac{r+1}{r}, k_j, r)$$

optimal LRC code, the layer can be decoded from $R_j$ nodes by a property of the optimal LRC codes.

By way of example, given that $1 < j' \le j$ and that Layers j', j'+1, . . . j are decoded, the construction can provide that all the extra parities in Layer j' $-1$ are included as the information symbols in Layers j', j'+1, . . . j and are decoded. Also, we know from the encoding part that the extra parities in Layer j'$-1$ include of the r parity symbols in each group of the $$(n + (k_{j'1} - k_a)\frac{r+1}{r}, k_{j'-1}, r)$$

optimal LRC codes. Thus, according to the locality, the remaining symbol in all $$(k_{j'-1} - k_j)\frac{r+1}{r}$$

groups in each row can be reconstructed. Therefore, we get additional $$(k_{j'-1} - k_j)\frac{r+1}{r}$$

symbols in each row of Layer j'$-1$ from the extra parities. Together with the $R_j$ nodes we accessed in each row of Layer j'$-1$, we get $R_{j'-1}$ symbols and, we are able to decode Layer j'$-1$.

Locality: Since each row is encoded as a LRC code with locality r, every layer and the entire code also have locality r.

By way of example, the following parameters may be set as (n,k,l,r)=(12, 4, 3, 2), $(R_1,k_1,\ell_1)$=(8,6, 2), $(R_2,k_2,\ell_1,)$= (5,4, 2). The code is defined over $\mathbb{F}=GF(2^4)=\{0, 1, \alpha, \ldots, \alpha^{14}\}$, where a is a primitive element of the field. In total there may be $k\ell$ information symbols, these may be assumed as $u_{1,0}, u_{1,1}, \ldots, u_{1,5}, u_{2,0}, u_{2,1}, \ldots, u_{2,5}$. The example is based on the optimal LRC code constructions. The construction is shown below, each column is a node with 3 symbols:

$$\begin{bmatrix} C_{1,1,1} & C_{1,1,2} & C_{1,1,3} & C_{1,1,4} \\ C_{1,2,1} & C_{1,2,2} & C_{1,2,3} & C_{1,2,4} \\ C_{2,1,1} & C_{2,1,2} & C_{2,1,3} & C_{2,1,4} \end{bmatrix},$$

where every entry in Row m will be constructed as $f_m(x)$ for some polynomial $f_m(\bullet)$ and some filed element x as below, m=1, 2, 3.

According to embodiments, evaluation points are divided into 4 groups as $x \in A = \{A_1 = (1, \alpha^5, \alpha^{10}\}, A_2 = \{\alpha, \alpha^6, \alpha^{11}\}, A_3 = \{\alpha^2, \alpha^7, \alpha^{12}\}, A_4 = \{\alpha^3, \alpha^8, \alpha^{13}\})$. In addition, $A_5 = \{\alpha^4, \alpha^9, \alpha^{15}\}$ may be set as the evaluation points group for the extra parities. By defining $g(x) = x^3$, g(x) is a constant for each group $A_i$, i∈[5]. Then the first two rows are encoded with $f_m(x) = (u_{m,0} + u_{m,1}g(x) + u_{m,2}g^2(x)) + x(u_{m,3} + u_{m,4}g(x) + u_{m,5}g^2(x))$, m=1,2.

The last row is encoded with $f_3(x) = (f_1(\alpha^4) + f_1(\alpha^9)g(x)) + x(f_2(\alpha^4) + f_2(\alpha^9)g(x))$.

For each group, since g(x) is a constant, $f_m(x)$, m∈[3] can be viewed as a polynomial of degree 2. Any single failure can be recovered from the other 2 available nodes evaluated by the points in the same group. The locality r=2 is achieved.

Noticing that $f_1(x)$ and $f_2(x)$ are polynomials of degree 7, all information symbols can be reconstructed from the first $\ell_1$=2 rows of any $R_1$=8 available nodes.

Moreover, $f_3(x)$ has degree 4. With $R_2$=5 available nodes, we can first decode $f_1(\alpha^4), f_1(\alpha^9), f_2(\alpha^4), f_{12}(\alpha^9)$ in row 3. Then, $f_1(\alpha^{14}), f_2(\alpha^{14})$ can be decoded due to the locality r=2. At last, together with the 5 other evaluations of $f_1(x)$ and $f_2(x)$ obtained in Rows 1 and 2, we are able to decode all information symbols

Flexible PMDS codes

According to embodiments, flexible storage codes may be configured for PMDS codes. PMDS codes may be used to overcome mixed types of failures in Redundant Arrays of Independent Disks (RAID) systems using Solid-State Drives (SSDs). A code consisting of an $\ell \times$ array is an $(n,k,\ell,s)$ PMDS code if it can tolerate n−k node or column failures and s additional arbitrary symbol failures in the code.

By way of example, letting $\ell_0=0$ and $\{(k_j, \ell_j): 1 \leq j \leq a\}$ satisfying requirements of a flexible code. We define an $(n,k,\ell,s)$ flexible PMDS code parameterized by $\{(k_j, \ell_j): 1 \leq j \leq a\}$ such that any row in $[\ell_{j-1}+1, \ell_j]$ is an $(n,k_j)$ MDS code, and from the first $\ell_j$ rows, we can reconstruct the entire information if there are up to n−kj node failures and up to s additional arbitrary symbol failures, $1 \leq j \leq a$. As mentioned, for PMDS codes, $R_j=k_j$.

Note that different from above, the number of information symbols for a flexible PMDS code is at most $\ell-s \equiv K$.

FIG. 7 illustrates a graphical representation of a flexible PMDS storage code according to one or more embodiments. Flexible PMDS code 700 may be a (5; 3; 4; 2) flexible PMDS code with $\{(k_1, \ell_1), (k_2, \ell_2)\}=\{(4,3), (3,4)\}$. Assuming there is only a value of failures, such as "*" as failures, the first four nodes can be used to decode, each node accessing the first three symbols. If both "*" and "4" are failures, we can decode from Nodes 1; 3; 4, each node accessing 4 symbols. In both cases, the remaining K=k$\ell$−s=10 symbols are independent and sufficient to reconstruct the entire information. The details of the encoding and decoding for this construction are presented herein.

According to embodiments, a flexible PMDS code can encode the information using Gabidulin code into auxiliary symbols, which are allocated to each layer according to $k_j$, $j \in [a]$. MDS codes with different dimensions are then applied to each row, thus ensuring flexible information reconstruction. Configurations may utilize a general construction of PMDS codes for any k and s using Gabidulin codes. In addition to the construction, embodiments include applying the construction to flexible PMDS codes.

An (N,K) Gabidulin code over the finite field $\mathbb{F}=GF(q^L)$, $L \geq N$ is defined by the polynomial $f(x)=\Sigma_{i=0}^{K-1} u_i x^{q^i}$, where $u_i \in \mathbb{F}$, $i=0,1,\ldots,K-1$ is the information symbol. The N code word symbols are $f(\alpha_1), f(\alpha_2), \ldots, f(\alpha_N)$ where the N evaluation points $\alpha_1, \ldots, \alpha_N$ are linearly independent over GF(q). From any K independent evaluation points over GF(q), the information can be recovered.

By way of example, the $(n,k,\ell,s)$ code word may be an $\ell \times n$ matrix over $\mathbb{F}=GF(q^{k\ell})$ such as:

$$\begin{bmatrix} C_{1,1} & C_{1,2} & \cdots & C_{1,n} \\ C_{2,1} & C_{2,2} & \cdots & C_{2,n} \\ \vdots & \vdots & \ddots & \vdots \\ C_{\ell,1} & C_{\ell,2} & \cdots & C_{\ell,n} \end{bmatrix}$$

where each column is a node. By setting $K=k\ell-s$, $C_{m,i} \in \mathbb{F}$, $m \in [\ell]$, $i \in [k]$ are the K+s code word symbols from a (K+s, K) Gabidulin code, and for each row $m, m \in [\ell]$.

$$[C_{m,k+1}, \ldots, C_{m,n}] = [C_{m,1}, \ldots, C_{m,k}]G_{MDS}$$

where $G_{MDS}$ is $k \times (n-k)$ encoding matrix of an $(n,k)$ systematic MDS code over GF(q) that generates the parity. Considering that $t_m$ symbols in row m, $m \in [\ell]$ are equivalent to evaluations of f(x) with $$\sum_{m=1}^{\ell} \min(t_m, k)$$

evaluation points that are linearly independent over GF(q). Thus, with any n−k node failures and s symbol failures, we have $t_m \leq k$ and $$\sum_{m=1}^{\ell} \min(t_m, k) = \sum_{m=1}^{\ell} t_m = \ell k - s = K.$$

Then, with the K linearly independent evaluations of f(x), we can decode all information symbols. Next, we show how to construct flexible PMDS codes. Rather than generating extra parities as constructions above, the main idea here is that we divide our code into multiple layers, and each layer applies a construction with a different dimension.

Embodiments may construct a $(n,k,\ell,s)$ flexible PMDS code over $GF(q^N)$ parameterized by $\{(k_j, \ell_j): 1 \leq j \leq a\}$ satisfying requirements of a flexible code and with an (N,K) Gabidulin code over, $$GF(q^N), N = \sum_{j=1}^{a} k_j(k_j|\ell_j - \ell_{j-1}), K = \ell k - s$$

and a set of $(n, k_j)$ systematic MDS codes over GF(q).

With respect to encoding: $C_{j,m,i}$ is the symbol in the $m_j$-th row of Layer $j$, and in the i-th node, $j \in [a]$, $m_j \in |\ell_j - \ell_{j-1}|$, $i \in [n]$. We first encode the K information symbols using the (N,K) Gabidulin code. Then, we set the first $k_j$ code word symbols in each row: $C_{j,m,i}$, $j \in [a]$, $m_j \in |\ell_j - \ell_{j-1}|$, $i \in [k_j]$, as the code word symbols in the (N,K) Gabidulin code. The remaining $n-k_j$ code word symbols in each row are $$[C_{j,m_j,k_j+1}, \ldots, C_{j,m_j,n}] = [C_{j,m_j,1}, \ldots, C_{j,m_j,k_j}]G_{n,k_j}$$

where $G_{n,k}$ is the encoding matrix (to generate the parity check symbols) of the $(n, k_j)$ systematic MDS code over GF(q).

With respect to decoding: for $n-k_j$ failures, we access the first $\ell_J$ rows (the first J layers) from each node. The code structure in each layer is similar to the general PMDS code, and a union of $t_{mj}$ symbols in Row $m_j$ of Layer j, $j \leq J$, they are equivalent to evaluations of f(x) with $$\sum_{j=1}^{J} \sum_{m_j=1}^{\ell_j - \ell_{j-1}} \min(t_{m_j}, k)$$

linearly independent points over GF(q) in $GF(q^N)$. Thus, with $n-k_J$ node failures and s symbol failures, we have $t_{m_j} \leq K_J \leq K_j$ for $j \in [J]$, and $$\sum_{j=1}^{J} \sum_{m_j=1}^{\ell_j - \ell_{j-1}} \min(t_{m_j}, k_j) = \sum_{j=1}^{J} \sum_{m_j=1}^{\ell_j - \ell_{j-1}} t_{m_j} = \ell_J k_J - s = K$$

Then, the information symbols can be decoded from K linearly independent evaluations of f(x).

Flexible MSR Codes

Regarding flexible MSR codes, embodiments can include a number of parity nodes is denoted by r=n−k. The repair bandwidth is defined as the amount of transmission required to repair a single node erasure, or failure, from all remaining nodes (called helper nodes), normalized by the size of the node. For an (n, k) MDS code, the repair bandwidth is bounded by the minimum storage regenerating (MSR) bound as $$b \geq \frac{n-1}{n-k}.$$

An MDS code achieving the MSR bound is called an MSR code. For MSR vector codes, each symbol is a vector. As one of the most popular codes in practical systems, Reed-Solomon (RS) code, where each symbol is a scalar.

As discussed herein, a set of MDS codes can recover the information symbols by any pair $(k_j, \ell_j)$, which means that for the first $\ell_j$ symbols in each node, code according to embodiments is an $(n, k_j, \ell_j)$, MDS code. In addition, we require the optimal repair bandwidth property for flexible MSR codes. A flexible MSR code is defined to be a flexible storage code as such that $R_j=k_j$, and a single node failure is recovered using a repair bandwidth satisfying the MSR bound.

According to embodiments, codes in this section may be similar to constructions according to other embodiments above, with additional restrictions on the parity check matrices and the extra parities. A key point here may be that extra parities and the information symbols in lower layers are exactly the same and they also share the same parity check sub-matrix. To repair the failed symbol with smallest bandwidth, the extra parities are viewed as additional helpers and the required information can be obtained for free from the repair of the lower layers.

An example is provided to illustrate 2 layers and then present our constructions based on vector and scalar MSR codes, respectively.

Constructing an (n, k, $\ell$)=(4, 2, 3) flexible MSR code parameterized by $(k_1, \ell_1)$=(3, 2) and $(k_2, \ell_2)$=(2; 3). The reconstruction of the entire information and the repair bandwidth are described above. Initially, the following is set $\mathbb{F}$ =GF($2^2$)={0,1, $\beta$, $\beta^2$=1+$\beta$}, where $\beta$ is a primitive element of GF($2^2$). Our construction is based on the following (4; 2; 2) MSR vector code over $\mathbb{F}^2$ with parity check matrix $$H = \begin{bmatrix} h_{1,1} & h_{1,2} & h_{1,3} & h_{1,4} \\ h_{2,1} & h_{2,2} & h_{2,3} & h_{2,4} \end{bmatrix} = \begin{bmatrix} 0 & 1 & 1 & 0 & 1 & 0 & 0 & 0 \\ 1 & 1 & 1 & 1 & 0 & 1 & 0 & 0 \\ 0 & 1 & 1 & 1 & 0 & 0 & 1 & 0 \\ 1 & 0 & 1 & 0 & 0 & 0 & 0 & 1 \end{bmatrix}$$

where each $h_{i,j}$ is a 2×2 matrix over $\mathbb{F}$. A code word symbol $c_i$ is $\mathbb{F}^2$, i=1,2,3,4, and the code word $[c_1^T, c_2^T, c_3^T, c_4^T]^T \in (\mathbb{F}^2)^4$ in the null space of H. A (4; 2) MDS code may be checked using any two code word symbols suffice to reconstruct the entire information. The repair matrix is defined as $$S_1 = \begin{bmatrix} 1 & 0 & 0 & 0 \\ 0 & 0 & 0 & 1 \end{bmatrix}.$$

$$S_2 = \begin{bmatrix} 1 & 0 & 0 & 0 \\ 0 & 0 & 1 & 0 \end{bmatrix}.$$

$$S_3 = \begin{bmatrix} 1 & 0 & 1 & 0 \\ 0 & 1 & 1 & 0 \end{bmatrix}.$$

$$S_4 = \begin{bmatrix} 0 & 1 & 1 & 0 \\ 0 & 0 & 0 & 1 \end{bmatrix}.$$

When node $* \in \{1,2,3,4\}$ fails, the node $c^*$ can be repaired by equations $S_* \times H \times [c_1^T, c_2^T, c_3^T, c_4^T]^T=0$. In particular, helper i, i≠* transmits $$S_* \begin{bmatrix} h_{1,i} \\ h_{2,i} \end{bmatrix} c_i,$$

which is 1 symbol in $\mathbb{F}$, achieving an optimal total repair bandwidth of 3 symbols in $\mathbb{F}$.

According to embodiments, a flexible MSR code includes every entry in the code array is a vector in $\mathbb{F}^2$. The code array is shown as below, each column being a node $$\begin{bmatrix} C_{1,1,1} & C_{1,1,2} & C_{1,1,3} & C_{1,1,4} \\ C_{1,2,1} & C_{1,2,2} & C_{1,2,3} & C_{1,2,4} \\ C_{2,1,1} & C_{2,1,2} & C_{2,1,3} & C_{1,1,4} \end{bmatrix}.$$

The code has 2 layers, where $C_{1,m_1,i} \in \mathbb{F}^2$ are in Layer 1 and $C_{2,m_2,i}$ are in Layer 2 with $m_1$=1,2, $m_2$=1, i[4]. Each $C_{j,m_j,i}$ is the vector $[c_{j,m_j,i,1}, c_{j,m_j,i,2}]^T$ with elements in $\mathbb{F}$. The code totally contains 48 bits with 24 information bits, and each node contains 12 bits. We define the code with the 3 parity check matrices shown below. Let $$H_1 = \begin{bmatrix} h_{1,1} & h_{1,2} & h_{1,3} & h_{1,4} & h_{1,1} \\ h_{2,1} & h_{2,2} & h_{2,3} & h_{2,4} & \beta h_{2,1} \end{bmatrix},$$

$$H_2 = \begin{bmatrix} h_{1,1} & h_{1,2} & h_{1,3} & h_{1,4} & h_{1,2} \\ h_{2,1} & h_{2,2} & h_{2,3} & h_{2,4} & \beta h_{2,2} \end{bmatrix},$$

$$H_3 = \begin{bmatrix} h_{1,1} & h_{1,2} & h_{1,3} & h_{1,4} & h_{1,1} \\ \beta h_{2,1} & \beta h_{2,2} & h_{2,3} & h_{2,4} & \beta h_{2,4} \end{bmatrix}.$$

The code is defined by $$H_1 \times [C_{1,1,1}^T, C_{1,1,2}^T, C_{1,1,3}^T, C_{1,1,4}^T, C_{2,1,1}^T]^T=0,$$

$$H_2 \times [C_{1,2,1}^T, C_{1,2,2}^T, C_{1,2,3}^T, C_{1,2,4}^T, C_{2,1,2}^T]^T=0,$$

$$H_3 \times [C_{2,1,1}^T, C_{2,1,2}^T, C_{2,1,3}^T, C_{2,1,4}^T]^T=0.$$

According to an exemplary embodiment, (n,k,$\ell$)=(4; 2; 3) flexible MSR code parameterized by $(k_j, \ell_j) \in \{(3,2), (2,3)\}$. To check that the that the code defined by $H_1$ or $H_2$ is an (5, 2) MDS code, and H3 defines an (4; 2) MDS code, an index of a failed node may be $* \in \{1,2,3,4\}$. For the repair, it is first noted that for i=1,2.

$$rank\left(S_* \begin{bmatrix} h_{1,i} \\ h_{2,i} \end{bmatrix}\right) = rank\left(S_* \begin{bmatrix} h_{1,i} \\ \beta h_{2,i} \end{bmatrix}\right) = \begin{cases} 2, i = * \\ 1, i \neq * \end{cases}.$$

According to embodiments a repair matrix S* as described here can repair a failed node *:

$$S_* \times H_1 \times [C_{1,1,1}^T, C_{1,1,2}^T, C_{1,1,3}^T, C_{1,1,4}^T, C_{2,1,1}^T]^T=0,$$

$$S_* \times H_2 \times [C_{1,2,1}^T, C_{1,2,2}^T, C_{1,2,3}^T, C_{1,2,4}^T, C_{2,1,2}^T]^T=0,$$

$$S_* \times H_3 \times [C_{2,1,1}^T, C_{2,1,2}^T, C_{2,1,3}^T, C_{2,1,4}^T]^T=0.$$

For helper i∈[4], i≠*, it transmits $$S_* \begin{bmatrix} h_{1,i} \\ h_{2,i} \end{bmatrix} C_{1,1,i},$$

-continued $$S_* \begin{bmatrix} h_{1,i} \\ h_{2,i} \end{bmatrix} C_{1,2,i},$$

$$S_* \begin{bmatrix} h_{1,i} \\ \bar{\beta} h_{2,i} \end{bmatrix} C_{2,1,i},$$

where $\bar{\beta}=\beta$ if i=1,2 and $\bar{\beta}=1$ if i=3,4. Repair of a failed node may also require $$S_* \begin{bmatrix} h_{1,1} \\ \beta h_{2,1} \end{bmatrix} C_{2,1,1} \text{ and } S_* \begin{bmatrix} h_{1,2} \\ \beta h_{2,2} \end{bmatrix} C_{2,1,2}.$$

For any failed node, one 1 symbol is needed form each of the remaining $C_{j,m_j,i}$, which meets the MSR bound.

In this example, codes in the first layer are not required to be MSR codes, thus resulting in a smaller field. However, the rank condition guarantees the optimal repair bandwidth for the entire code. Also, in our general constructions, we do not require the codes in Layers 1 to a−1 to be MSR codes.

Embodiments are also directed to construction of flexible MSR codes by applying a construction to the vector MSR code and the RS MSR code.

Flexible MSR Codes with Parity Check Matrices

According to embodiments, codes may be defined by parity check matrices and certain choices of the parity check matrices allow for a flexible MSR code. According to embodiments, a second construction is provided. The code, for example, may be defined in some $\mathbb{F}^L$ parameterized by $(k_j, \ell_j)$, $j \in [a]$ such that $k_j \ell_j = k\ell$, $k_1 > k_2 > \ldots k_a = k$, $\ell_a = \ell$. The parity check matrix for the mj-th row in Layer j $\in$ [a] is defined as $$H_{j,m_j} = [h_{j,m_j,1} \ldots h_{j,m_j,n} g_{j,m_j,1} \ldots g_{j,m_j,k_j-k_a}]$$

where each $h_{j,m_j,n} g_{j,m_j,1}$ is an rL×L matrix with elements in $\mathbb{F}$. The $(n+k_j-k_a, k_j)$MDS code $m_j$-th row in Layer j is defined by $$H_{j,m_j} \times [C_{j,m_j,1}^T, C_{j,m_j,1}^T, \ldots, C_{j,m_j,1}^T, C_{j,m_j,1}^T, \ldots, C_{j,m_j,1}^T]^T = 0,$$

where $C_{j,m_j,i}$ are the stored code word symbols and $C'_{j,m_j,1}$ are the extra parities. In this construction, when we encode the extra parities into lower layers, we set the code word symbols and the corresponding parity check matrix entries exactly the same. Specifically, for Layers j<j'≤a the following may be set as $$g_{j,x,y} = h_{j',x',y'},$$

$$C'_{j,x,y} = C_{j',x',y'}$$

Here, for $x \in [1_j - 1_{j-1}]$, $k_j - k_a + 1 \leq y \leq k_{j'-1} - k_a$, then $g_{j,x,y}$ corresponds to $h_{j',x',y'}$ in Layer j', and $$x' = \left\lfloor \frac{x(k_{j'-1} - k_{j'}) + y}{k_{j'}} \right\rfloor$$

$$y' = (x(k_{j'-1} - k_{j'}) + y) \bmod k_{j'}$$

where "mod" denotes the modulo operation.

As a result, the 2 extra parities in Layer 1 are exactly the same as the first 2 symbols in Layer 2 with $C'_{1,1,1} = C_{2,1,1}$, $g_{1,1,1} = h_{2,1,1}$ and $C'_{1,2,1} = C_{2,1,2}$, $g_{1,2,1} = h_{2,1,2}$.

The code defined by the second construction is a flexible MSR code when an MDS condition and Ran condition satisfy requirements for MDS codes and the repair matrices can be used for every parity check matrix. When an MDS property is satisfied, the second construction is the same as the first construction described above by defining the MDS codes with parity check matrices. For repair, a repair matrix may be used in each row to repair failed nodes. For example, assuming node *, * ∈ [n] failed, a repair matrix S* may be used in each row repair, such that $$S_* \times H_{j,m_j} \times [C_{j,m_j,1}^T, C_{j,m_j,2}^T, \ldots, C_{j,m_j,n}^T, C'_{j,m_j,1}^T, \ldots, C'_{j,m_j,k_j-k_a}^T]^T = 0.$$

The information symbols $C'_{j,m_j,1} = C'_{j,m_j,k_j-k_a}$ in the lower layers with the same corresponding parity check sub-matrices can be retrieved from lower levels such that the node can be repaired by n−I helpers. Only L/r symbols are needed from each helper in order to achieve the optimal repair bandwidth.

Assuming the field size, $|\mathbb{E}| > rn$ and $\lambda_{i,j} \in \mathbb{E}$, $i \in [n]$, $j = 0, 1, \ldots, r-1$ are rn distinct elements. The parity matrix for the (n,k) MSR code can be represented as $$H = \begin{bmatrix} I & I & \ldots & I \\ A_1 & A_2 & \ldots & A_n \\ \vdots & \vdots & \ddots & \vdots \\ A_1^{r-1} & A_1^{r-1} & \ldots & A_n^{r-1} \end{bmatrix},$$

where I is the L×L identify matrix and $$A_i = \sum_{k=0}^{L-1} \lambda_{i,z_i} e_z e_z^T \cdot e_z$$

is a vector of length $L=r^n$ with all elements 0 except the z-th element which is equal to 1. The r-ary expansion of z may be described as $z=(z_n z_{n-1} \ldots z_1)$, where $0 \leq z_i \leq r-1$ is the i-th digit from the right and $$z = \sum_{i=0}^{r-1} z_i r^i.$$

As such, $A_i$ is an L×L diagonal matrix with element $\lambda_{i,z_i}$. The L×L repair matrix $S_*, * \in [n]$ are also defined as:

$$S_* = \text{Diag}(D_*, D_*, \ldots, D_*)$$

with $$\frac{L}{r} \times L$$

matrix $D_*$ and it is shown that:

$$\text{rank}\left(S_* \begin{bmatrix} I \\ A_i \\ \vdots \\ A_i^{r-1} \end{bmatrix}\right) = \text{rank}\begin{pmatrix} D_* \\ D_* A_i \\ \vdots \\ A D_*^{r-1} \end{pmatrix} = \begin{cases} L, & i = * \\ \frac{L}{r}, & i \neq * \end{cases}.$$

Here, for $0 \leq x \leq r^{n-1} - 1, 0 \leq y \leq r^{n-1}$, the (x, y)-th entry of $D_*$ equals 1 if the r-ary expansion of x and y satisfies $(x_{n-1}, x_{n-1}, \ldots, x_1) = (y_n, y_{n-1}, \ldots, y_{i+1}, y_{i-1}, \ldots, y_1)$, and otherwise it equals 0.

Considering an extended field $\mathbb{F}$ from $\mathbb{E}$ and denoting $\mathbb{F}^* \cong \mathbb{F} \setminus \{0\}$, $\mathbb{E}^* \cong \mathbb{E} \{0\}$. The $\mathbb{F}^*$ can be partitioned to $$t \triangleq \frac{|\mathbb{F}^*|}{|\mathbb{E}^*|}$$

cosets $\{\beta_1 \mathbb{E}^*, \beta_2 \mathbb{E}^*, \ldots, \beta_t \mathbb{E}^*\}$, for some elements $\beta_1, \beta_2, \ldots, \beta_t$ in $\mathbb{E}$. The storage nodes define (the first n nodes):

$$h_{j,m_j,i} = \begin{bmatrix} I \\ \beta_{j,m_j,i} A_i \\ \beta_{j,m_j,i}^2 A_i^2 \\ \vdots \\ \beta_{j,m_j}^{r-1} A_i^{r-1} \end{bmatrix}$$

where $\beta_{j,m_j}$ is chosen from $\{\beta_1, \beta_2, \ldots, \beta_t\}$. The additional coefficient may be set as $\beta_{j,m}$. Then, the extra parity entries $g_{j,m_j,i}$ can be obtained and $A_i$ might show in $H_{j,m_j}$ in several times since the extra parity matrices are the same as the information symbols in lower layers. We choose the additional coefficients as below. Condition 1. In each $H_{j,m_j}$, the additional coefficients for the same $A_i$ are distinct. With parity check matrices, Construction 2 is a flexible MSR code.

To calculate the required field size, the disclosure discusses how many additional coefficients are required for our flexible MSR codes satisfying Condition 1. In the following, we propose two possible coefficient assignments. It should be noticed that one might find better assignments with smaller field sizes.

The simplest coefficient assignment assigns different additional coefficients to different rows, i.e., $\beta_{j,m_j}$ to Row $m_j$ in Layer j for the storage nodes (the first n nodes). By doing so, the parity check matrix $\beta_{j,m_j} A_i$, $j \in [a]$, $m_j \in [\ell_j - \ell_{j-1}] i \in [n]$ will show at most twice in Construction 2, i.e., in Layer j corresponding to storage Node i, and in Layer j' corresponding to an extra parity, for some j>j'. Hence, the same $A_i$ will correspond to different additional coefficients in the same row and Condition 1 is satisfied. In this case, we need a field size of $\ell |\mathbb{E}|$.

In the second assignment, we assign different additional coefficients in different layers for the storage nodes (the first n nodes), but for different rows in the same layer, we might use the same additional coefficient. For a given row, the storage nodes will not conflict with the extra parities since the latter correspond to the storage nodes in other layers. Also, the extra parities will not conflict with each other if they correspond to the storage nodes in different layers. Then, we only need to check the extra parities in the same row corresponding to storage nodes in the same layer. For the extra parities/storage nodes $g_{j,x,y} = h_{j',x',y'}$, given j, x, j', y', the additional coefficients should be different. In this case $k_j - k_a + 1 \leq y \leq k_{j-1} - k_a$, and there will be at most $$\left\lceil \frac{k_{j'-1} - k_{j'}}{k_{j'}} \right\rceil$$

that make y'a constant.

By assigning $$\left\lceil \frac{k_{j'-1} - k_{j'}}{k_{j'}} \right\rceil$$

number of $\beta$ in Layer j', j'$\geq$2 (in Layer 1 we only need one $\beta$), Condition 1 is satisfied.

The total number of required additional coefficients is $$\sum_{j=2}^{\alpha} \left\lceil \frac{k_{j-1} - k_j}{k_j} \right\rceil \triangleq t.$$

Since $(k_{j-1} - k_j) \ell_j = k_j (\ell_j - \ell_{j-1})$ then $$t = 1 + \sum_{j=2}^{\alpha} \left\lceil \frac{k_{j-1} - k_j}{k_j} \right\rceil = 1 + \sum_{j=2}^{\alpha} \left\lceil \frac{\ell_j - \ell_{j-1}}{\ell_{j-1}} \right\rceil \leq 1 + \sum_{j=2}^{\alpha} (\ell_j - \ell_{j-1}) \leq \ell.$$

In the best case, $k_{j-1} - k_j \leq k_j$ for all j, the number of coefficients is a, and $|\mathbb{F}| \geq a |\mathbb{E}|$.

Compare constructions with another flexible MSR constructions, embodiments provide code such tat in each node $\mathbb{F} \ell^{(n-k)2}$, where $|\mathbb{F}| \geq t(n-k)n$. Namely, each node requires $\ell(n-k)^n \log_2(t(n-k)n)$ bits. Unlike other codes, configurations here in allow for choosing $\ell$ =S.

Embodiments are also directed to Flexible RS MSR codes including construction of Reed-Solomon (RS) MSR codes.

An RS(n, k) code over the finite field IF may be defined as $$RS(n,k) = \{(f(\alpha_1), f(\alpha_2), \ldots, f(\alpha_n)) : f \in \mathbb{F}[x], \deg(f) \leq k-1\}.$$

where the evaluation points are define as $\{\alpha_1, \alpha_1, \ldots, \alpha_1\} \subseteq \mathbb{F}$ and deg( ) denotes the degree of a polynomial. The encoding polynomial $f(x) = u_0 + u_1 x + \ldots + u_{k-1} x^k$, where $u_i \in \mathbb{F}$, $i = 0, 1, \ldots, k-1$ are the information symbols. Every evaluation symbol $f(\alpha_i)$, $i \in [n]$ is called a code word symbol. RS codes are MDS codes, namely from any k code word symbols, the information can be recovered.

By letting $\mathbb{B}$ be the base of field $\mathbb{F}$ such that $\mathbb{F} = \mathbb{B}^L$. For repairing RS codes, any linear repair scheme for a given RS(n,k) over the finite field $\mathbb{F} = \mathbb{B}^L$ is equivalent to finding a set of repair polynomials $p_{*,v}(x)$ such that for the failed node $f(\alpha_*), * \in [n]$, $$\text{rank}_\mathbb{B}(\{p_{*,v}(\alpha_*) : v * \in [L]\}) = L,$$

where the rank is defined as rank $\mathbb{B}$ ($\{\gamma_1, \gamma_2, \ldots \gamma_i\}$), as the cardinality of a maximum subset of $\{\gamma_1, \gamma_2, \ldots \gamma_i\}$ that is linearly independent over $\mathbb{B}$.

The transmission from helper $f(\alpha_i)$ is $$T_r \mathbb{F} / \mathbb{B}(p_{*,v}(\alpha_i) f(\alpha_i)), v \in [L],$$

where the trace function $T_r \mathbb{F} / \mathbb{B}(x)$ is a linear function such that for all $x \in \mathbb{F}$, $T_r \mathbb{F} / \mathbb{B}(x) \in \mathbb{B}$. The repair bandwidth for the i-th helper is $b_i = \text{rank} \mathbb{B}(\{p_{*,v}(\alpha_i) : v \in L\})$, symbols in $\mathbb{B}$. The Flexible RS MSR code construction is similar to Construction 2 based on parity check matrices.

According to embodiments, a third construction (construction 3) defines a code in $\mathbb{F} = GF(q^L)$ with a set of pairs $k_j$, $\ell_j \in [a]$ such that $k_j \ell_j = k \ell$, $k_1 > k_2 > \ldots k_a = k$, $\ell_a = \ell$, r=n−k. In the mj-th row in layer j∈[a] the code word symbols $C_{j,m_j,i}$, i∈[n] are define as $$C_{j,m_j,i} = f_{j,m_j}(\alpha_{j,m_j,i});$$

and the extra parities $C'_{j,m_j,i}$, i∈[$k_j$−$k_a$] are defined as $C'_{j,m_j,i}=f_{j,m_j}(\alpha_{j,m_j,i+n})$, where {$f_{j,m_j}(\alpha_{j,m_j,i})$, i∈[n+$k_j$−$k_a$]}, is a RS(n+$k_j$−$k_a$, $k_j$) code.

The encoding polynomial $f_{j,m_j}(x)$ and the evaluation point $\alpha_{j,m_j,i}$ may be defined.

In this construction, extra parities and the corresponding evaluation points are set exactly the same as the information symbols in lower layers, and extra parities are arranged in the same way as in Construction 2. Specifically, for $C'_{j,x,y}$ in Layer j, x∈[$l_j$−$l_{j-1}$], when $k_j$−$k_{j'-1}$+1≤y≤$k_j$−$k_{j'}$ for j+1≤j'≤a, it is encoded to Layer j' with $\alpha_{j,x,y+n}=\alpha_{j',x',y'}$ and $C'_{j,x,y}=C_{j',x',y'}$, with x', y'. The encoding polynomial $f_{j',m_{j'}}(x)\in \mathbb{F}$ in Layer j' is defined by the $k_{j'}$ evaluation points and the code word symbols from the extra parities.

Latency

In this section, we analyze the latency of obtaining the entire information using codes according to embodiments with a flexible number of nodes.

One of the key properties of the flexible storage codes presented in this disclosure is that the decoding rows are the first $\ell_j$ rows if we have $R_j$ available nodes. As a result, the decoder can simply download symbols one by one from each node, and symbols of Layer j can be used for Layers j, j+1, . . . , a. For one pair of ($R_j$, $\ell_j$), a random variable $T_j$ associated with the time for the first $R_j$ nodes transmitting the first $\ell_j$ symbols. $T_j$ is called the latency for the j-th layer. Instead of predetermining a fixed pair (R, $\ell$) for the system, flexible storage codes allow us to use all possible pairs ($R_j$, $\ell_j$)∈[a]. The decoder downloads symbols from all n nodes and as long as it obtains $\ell_j$ symbols from $R_j$ nodes, the download is complete. For flexible codes with Layers 1; 2; . . . ; a, we use $T_{1,2,\ldots,a}=min(T_j, j\in[a])$ to represent the latency.

Notice that for the fixed code with the same failure tolerance level, i.e., R=$R_a$, $\ell = \ell_a$, its latency is $T_a$. Since $T_{1,2,\ldots,a}=min(T_j, j\in[a])\leq T_a$, and given the storage size per node $\ell$, the number of nodes n, and recovery threshold R=$R_a$, the flexible storage code can reduce the latency of obtaining the entire information compared to any fixed array code.

Assuming the probability density function (PDF) of $T_j$ is $p_{R_j, \ell_j}(t)$, the expected delay can be calculated as $$E(T_j)=\int_0^\infty \tau_j p_{R_j, \ell_j}(\tau_j)d\tau_j.$$

If a fixed code is adopted, one can optimize the expected latency and get an optimal pair (R*, $\ell$*) for a given distribution. However, a flexible storage code still outperforms such an optimal fixed code in latency due to embodiments described herein and in particular the flexible storage code. Moreover, in practice the choice of (n, k, R, $\ell$) depends on the system size and the desired failure tolerance level and is not necessarily optimized for latency Regarding Hard Disk Drive (HDD) storage system as an example to calculate the latency of flexible storage codes according to embodiments, additional latency can be saved compared to a fixed MDS code. In this part, we compute the overall latency of a flexible code with ($R_1$, $\ell_1$), ($R_2$, $\ell_2$), and length n. Comparing latency with the latency of fixed codes with (n, $R_1$, $\ell_1$) and (n, $R_2$, $\ell_2$), respectively.

In the HDD latency model, the overall latency consists of the positioning time and the data transfer time. The positioning time measures the latency to move the hard disk arm to the desired cylinder and rotate the desired sector to under the disk head. As the accessed physical address for each node is arbitrary, we assume the positioning time is a random variable uniformly distributed, denoted by U(0, $t_{pos}$), where $t_{pos}$ is the maximum latency required to move through the entire disk. The data transfer time is simply a linear function of the data size, and we assume the transfer time for a single symbol in our code is $t_{trans}$. Therefore, the overall latency model is X+$\ell \cdot t_{trans}$, where X~U(0, $t_{pos}$) and $\ell$ is the number of accessed symbols.

Consider an (n, R, $\ell$) fixed code. When R nodes finish the transmission of $\ell$ symbols, all the information is obtained. The corresponding latency is called the R-th order statistics. For n independent random variables satisfying U(0, $t_{pos}$), the R-th order statistics for the positioning time, denoted by UR, satisfies a beta distribution:

$$U_R \sim Beta(R, n+1-R, -, t_{pos}).$$

with expectation $$E[U_R] = \frac{R}{n+1} t_{pos}.$$

For a random variable Y~Beta($\alpha$, $\beta$, a, c), the probability density function (pdf) is defined as $$f(Y = | y; \alpha, \beta, a, c) = \frac{(y-a)^{\alpha-1}(c-y)^{\beta-1}}{(c-a)^{\alpha+\beta-1}B(\alpha,\beta)},$$

$$\text{where } B(\alpha,\beta) = \int_{t=0}^1 t^{\alpha-1}(1-t)^{\beta-1}dt$$

is the beta function.

The expectation of overall latency for an (n, $R_1$, $\ell_1$) fixed code, denoted by $T_1$, is $$E[T_1] = \frac{R_1}{n+1} t_{pos} + \ell_1 t_{trans}.$$

Similarly, the expected overall latency $E(T_2)$ for the fixed (n, $R_2$, $\ell_2$) code is $$E[T_2] = \frac{R_2}{n+1} t_{pos} + \ell_2 t_{trans}.$$

Considering the flexible code with 2 layers, the difference of the positioning times $U_{R_1}$ and $U_{R_2}$ is $$\Delta U = U_{R_1} - U_{R_2} \sim Beta(R_1-R_2, n+1-(R_1-R_2), 0, t_{pos}).$$

The expectation of the overall latency for the flexible code denoted by $T_{1,2}$, may be denoted as $$E(T_{1,2}) = E(min(T_1, T_2))$$
$$= \begin{matrix} E(T_1 | T_1 - T_2 \leq 0)P(T_1 - T_2 \leq 0) + \\ E(T_2 | T_1 - T_2 \leq 0)P(T_1 T_2 > 0) \end{matrix}$$
$$= E(T_1) - E(T_1 - T_2 | T_1 - T_2 > 0)P(T_1 - T_2 > 0)$$

-continued $$= \int_{(\ell_2-\ell_1)t_{trans}}^{t_{pos}} \frac{R_1}{n+1}t_{pos} + \ell_1 t_{trans} - [\Delta U - (\ell_2-\ell_1)t_{trans}]f(\Delta U)d\Delta U,$$

where the last term is saved latency compared to an (n, $R_1$, $\ell_1$) code. The saved latency can be calculated as:

$$E(T_1 - T_{1,2}) = \int_{(\ell_2-\ell_1)t_{trans}}^{t_{pos}} [\Delta U - (\ell_2-\ell_1)t_{trans}]f(\Delta U)d\Delta U$$
$$= \frac{at_{pos}}{a+b}I_{1-x}(b, a+1) - (\ell_2-\ell_1)t_{trans}I_{1-x}(b, a),$$
$$\text{where } B(\alpha, \beta) = \int_{t=0}^{1} t^{\alpha-1}(1-t)^{\beta-1}dt$$

is the beta function.

The expectation of overall latency for an (n, $R_1$, $\ell_1$) fixed code, denoted by $T_1$ is $$E(T_1) = \frac{R_1}{n+1}t_{pos} + \ell_1 t_{trans}.$$

Similarly, the expected overall latency $E(T_2)$ for the fixed (n, $R_2$, $\ell_2$) code is $$E(T_2) = \frac{R_2}{n+1}t_{pos} + \ell_2 t_{trans}.$$

Considering the flexible code with 2 layers, the difference of the positioning times $U_{R1}$ and $U_{R2}$ is $$\Delta U = U_{R_1} - U_{R_2} \sim \text{Beta}(R_1-R_2, n+1-(R_1-R_2), 0, t_{pos}).$$

As a result, an expectation of the overall latency for flexible code described herein, denoted by $T_{1,2}$, may be $$E(T_{1,2}) = E(\min(T_1, T_2))$$
$$= \frac{E(T_1 \mid T_1 - T_2 \le 0)P(T_1 - T_2 \le 0) + }{E(T_2 \mid T_1 - T_2 \le 0)P(T_1 T_2 > 0)}$$
$$= E(T_1) - E(T_1 - T_2 \mid T_1 - T_2 > 0)P(T_1 - T_2 > 0)$$
$$= \int_{(\ell_2-\ell_1)t_{trans}}^{t_{pos}} \frac{R_1}{n+1}t_{pos} + \ell_1 t_{trans} - [\Delta U - (\ell_2-\ell_1)t_{trans}]f(\Delta U)d\Delta U,$$

where the last term is saved latency compared to an (n, $R_1$, $\ell_1$) code.

The latency of a fixed MDS code is a function of n, R, $\ell$, $t_{pos}$, and $t_{trans}$. According to embodiments, one can optimize the code reconstruction threshold R* based on other parameters. However, the system parameters might change over time and one "optimal" R* cannot.

Figure 8:
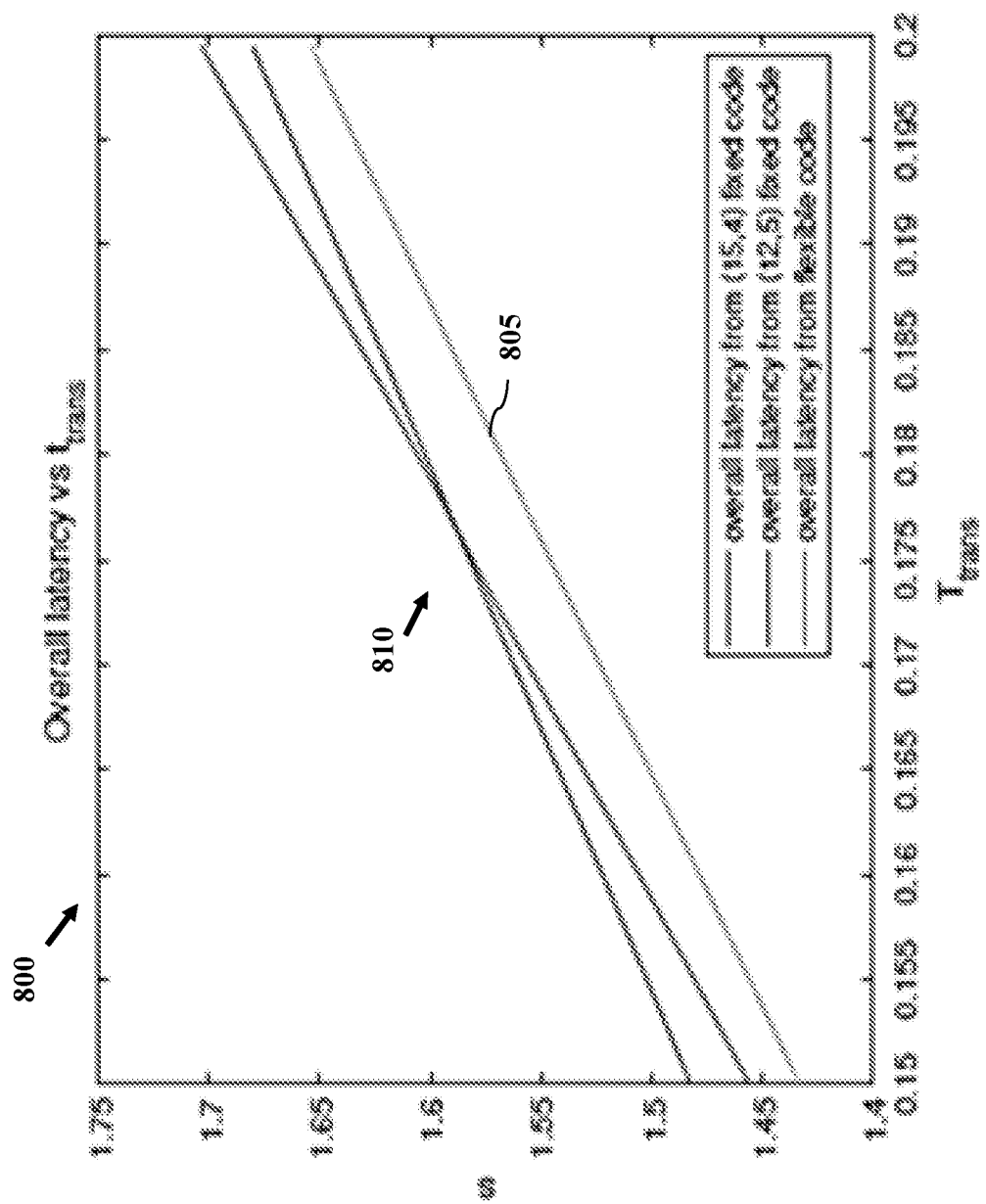
FIG. 8 illustrates a graphical representation of latency according to one or more embodiments.

FIG. 8 illustrates a graphical representation of latency according to one or more embodiments. Graph 800 includes overall latency of fixed codes as 810 and flexible recoverable codes latency as 805. Parameters may be fixed and the unit data transfer time $t_{trans}$ may be change. For fixed codes, a smaller R provides a lower latency with a smaller $t_{trans}$, and when $t_{trans}$ grows, a larger R is preferred. However, our flexible code always provides a smaller latency, and can save 2%-5% compared to the better of the two fixed codes In conclusion, embodiments are directed to flexible storage codes and investigation of the construction of such codes under various settings. Our analysis shows the benefit of our codes in terms of latency.

While this disclosure has been particularly shown and described with references to exemplary embodiments thereof, it will be understood by those skilled in the art that various changes in form and details may be made therein without departing from the scope of the claimed embodiments.

What is claimed is:

1. A method for reconstructing data using flexible storage codes, the method comprising:
    determining, by a device, a node failure for received information using a storage code for the information, wherein the storage code is encoded as information symbols into a number of storage nodes, and the received information is received from at least one of a plurality of storage nodes;
    determining, by the device, a number of nodes and a number of symbols of a flexible storage code for error correction, wherein the flexible storage code is generated using the storage code for the information and wherein the number of nodes and the number of symbols of the flexible storage code is determined based on a number of node failures; and
    reconstructing, by the device, the received information using the determined number of nodes and the number of symbols of the flexible storage code,
    wherein the flexible storage code is configured as a flexible locally recoverable code (LRC), wherein flexible LRC is an array code for finite field of information, the array generated based on a code worth length n, dimension k, and code word symbol l, and wherein the code is parametrized by $\{(R_j, k_j, \ell_j): 1 \le j \le a\}$ that satisfies $k_j$, $\ell_j = k\ell$, $1 \le j \le a$, $k_1 > k_2 > \ldots > k_a = k$, $\ell_a = \ell$ and $$R_j = k_j + \frac{k_j}{r} - 1,$$

for single node failure recovery from a subset of nodes of the storage code.

2. The method of claim 1, wherein determining a node failure includes identifying at least one node failure from the storage code for the information.

3. The method of claim 1, wherein the plurality storage nodes are in a distributed network and information is received by the device with symbols encoded over a finite field into a number of nodes, the flexible storage code configured for a flexible number of nodes and symbols.

4. The method of claim 1, wherein the storage code is arranged as an array of codes including parameters for code word length, dimension and size of each storage node.

5. The method of claim 1, wherein the storage code is at least one of a maximum distance separable (MDS) storage code and a minimum storage regenerating (MSR) storage code.

6. The method of claim 1, wherein reconstructing the received information with the number of nodes and the number of symbols of a flexible storage code includes using a subarray of nodes and symbols of the storage code for the information.

7. A method for reconstructing data using flexible storage codes, the method comprising:
determining, by a device, a node failure for received information using a storage code for the information, wherein the storage code is encoded as information symbols into a number of storage nodes, and the received information is received from at least one of a plurality of storage nodes;
determining, by the device, a number of nodes and a number of symbols of a flexible storage code for error correction, wherein the flexible storage code is generated using the storage code for the information and wherein the number of nodes and the number of symbols of the flexible storage code is determined based on a number of node failures; and
reconstructing, by the device, the received information using the determined number of nodes and the number of symbols of the flexible storage code,
wherein the flexible storage code is configured as a flexible partial maximum distance separable code (PMDSC) wherein, wherein flexible PMDSC is an array code for finite field of information, the array generated based on a code worth length n, dimension k, code word symbol l, and extra symbol failures s, and wherein the code is parametrized by a set of $\{(R_j, k_j, \ell_j): 1 \leq j \leq a\}$ satisfying $k_j$, $\ell_j = k\ell$, $1 \leq j \leq a$, $k_1 > k_2 > \ldots > k_a = k$, $\ell_a = \ell$ and $R_j = k_j$ such that $\ell_j$ symbols are accessed in each node.

8. A method for reconstructing data using flexible storage codes, the method comprising:
determining, by a device, a node failure for received information using a storage code for the information, wherein the storage code is encoded as information symbols into a number of storage nodes, and the received information is received from at least one of a plurality of storage nodes;
determining, by the device, a number of nodes and a number of symbols of a flexible storage code for error correction, wherein the flexible storage code is generated using the storage code for the information and wherein the number of nodes and the number of symbols of the flexible storage code is determined based on a number of node failures; and
reconstructing, by the device, the received information using the determined number of nodes and the number of symbols of the flexible storage code,
wherein the flexible storage code is configured as a flexible minimum storage regenerating code (MSRC), wherein repair bandwidth is a minimum amount of transmission required to repair a single node failure from all remaining nodes normalized by size of the node, wherein the repair bandwidth is bounded by the minimum storage regenerating (MSR) bound as $$b \geq \frac{n-1}{n-k}$$

based on a code worth length n, and dimension k.

9. A device configured to reconstruct data using flexible storage codes, the device comprising:
a receiver configured to receive information from a distributed network; and
a controller coupled to the receiver, the controller configured to
determine a node failure for received information using a storage code for the information, wherein the storage code is encoded as information symbols into a number of storage nodes, and the received information is received from at least one of a plurality of storage nodes,
determine a number of nodes and a number of symbols of a flexible storage code for error correction, wherein the flexible storage code is generated using the storage code for the information and wherein the number of nodes and the number of symbols of the flexible storage code is determined based on a number of node failures, and
reconstruct the received information using the determined number of nodes and the number of symbols of the flexible storage code,
wherein the flexible storage code is configured as a flexible locally recoverable code (LRC), wherein flexible LRC is an array code for finite field of information, the array generated based on a code worth length n, dimension k, and code word symbol l, and wherein the code is parametrized by $\{(R_j, k_j, \ell_j): 1 \leq j \leq a\}$ that satisfies $k_j$, $\ell_j = k\ell$, $1 \leq j \leq a$, $k_1 > k_2 > \ldots > k_a = k$, $\ell_a = \ell$ and $$R_j = k_j + \frac{k_j}{r} - 1,$$

for single node failure recovery from a subset of nodes of the storage code.

10. The device of claim 9, wherein determining a node failure includes identifying at least one node failure from the storage code for the information.

11. The device of claim 9, wherein the plurality storage nodes are in a distributed network and information is received by the device with symbols encoded over a finite field into a number of nodes, the flexible storage code configured for a flexible number of nodes and symbols.

12. The device of claim 9, wherein the storage code is arranged as an array of codes including parameters for word length, dimension, and size of each storage node.

13. The device of claim 9, wherein the storage code is at least one of a maximum distance separable (MDS) storage code and a minimum storage regenerating (MSR) storage code.

14. The device of claim 9, wherein reconstructing the received information with the number of nodes and the number of symbols of a flexible storage code includes using a subarray of nodes and symbols of the storage code for the information.

15. A device configured to reconstruct data using flexible storage codes, the device comprising:
a receiver configured to receive information from a distributed network; and
a controller coupled to the receiver, the controller configured to
determine a node failure for received information using a storage code for the information, wherein the storage code is encoded as information symbols into a number of storage nodes, and the received information is received from at least one of a plurality of storage nodes,
determine a number of nodes and a number of symbols of a flexible storage code for error correction, wherein the flexible storage code is generated using the storage code for the information and wherein the number of nodes and the number of symbols of the flexible storage code is determined based on a number of node failures, and reconstruct the received information using the determined number of nodes and the number of symbols of the flexible storage code, wherein the flexible storage code is configured as a flexible partial maximum distance separable code (PMDSC) wherein, wherein flexible PMDSC is an array code for finite field of information, the array generated based on a code worth length n, dimension k, code word symbol l, and extra symbol failures s, and wherein the code is parametrized by a set of $\{(R_j, k_j, \ell_j): 1 \leq j \leq a\}$ satisfying $k_j$, $\ell_j = k\ell$, $1 \leq j \leq a$, $k_1 > k_2 > \ldots > k_a = k$, $\ell_a = \ell$ and $R_j = k_j$ such that $\ell_j$ symbols are accessed in each node.

16. A device configured to reconstruct data using flexible storage codes, the device comprising:
  a receiver configured to receive information from a distributed network; and
  a controller coupled to the receiver, the controller configured to
  determine a node failure for received information using a storage code for the information, wherein the storage code is encoded as information symbols into a number of storage nodes, and the received information is received from at least one of a plurality of storage nodes,
  determine a number of nodes and a number of symbols of a flexible storage code for error correction, wherein the flexible storage code is generated using the storage code for the information and wherein the number of nodes and the number of symbols of the flexible storage code is determined based on a number of node failures, and
  reconstruct the received information using the determined number of nodes and the number of symbols of the flexible storage code,
  wherein the flexible storage code is configured as a flexible minimum storage regenerating code (MSRC), wherein repair bandwidth is a minimum amount of transmission required to repair a single node failure from all remaining nodes normalized by size of the node, wherein the repair bandwidth is bounded by the minimum storage regenerating (MSR) bound as $$b \geq \frac{n-1}{n-k}$$

based on a code worth length n, and dimension k.

* * * * *